US012666660B2

(12) United States Patent
O'Brien et al.

(10) Patent No.: US 12,666,660 B2
(45) Date of Patent: Jun. 23, 2026

(54) TRANSISTOR STRUCTURES HAVING A DOPING LAYER ON TRANSITION METAL DICHALCOGENIDE LAYERS OUTSIDE OF THE CHANNEL REGION

(71) Applicant: Intel Corporation, Santa Clara, CA (US)

(72) Inventors: Kevin P. O'Brien, Portland, OR (US); Rachel Steinhardt, Beaverton, OR (US); Chelsey Dorow, Portland, OR (US); Carl H. Naylor, Portland, OR (US); Kirby Maxey, Hillsboro, OR (US); Sudarat Lee, Hillsboro, OR (US); Ashish Verma Penumatcha, Beaverton, OR (US); Uygar Avci, Portland, OR (US); Scott Clendenning, Portland, OR (US); Tristan Tronic, Aloha, OR (US); Mahmut Sami Kavrik, Eugene, OR (US); Ande Kitamura, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/091,192

(22) Filed: Dec. 29, 2022

(65) Prior Publication Data

US 2024/0222482 A1    Jul. 4, 2024

(51) Int. Cl.
| | |
|---|---|
| *H01L 29/76* | (2006.01) |
| *H01L 21/02* | (2006.01) |
| *H01L 29/06* | (2006.01) |
| *H01L 29/24* | (2006.01) |
| *H01L 29/423* | (2006.01) |

| | |
|---|---|
| *H01L 29/66* | (2006.01) |
| *H01L 29/775* | (2006.01) |
| *H10D 30/43* | (2025.01) |
| *H10D 30/67* | (2025.01) |
| *H10D 48/36* | (2025.01) |
| *H10D 62/10* | (2025.01) |

(Continued)

(52) U.S. Cl.
CPC ........... *H10D 48/362* (2025.01); *H10D 30/43* (2025.01); *H10D 30/6735* (2025.01); *H10D 62/121* (2025.01); *H10D 62/80* (2025.01); *H10D 99/00* (2025.01); *H10P 14/3436* (2026.01); *H10P 14/3462* (2026.01)

(58) Field of Classification Search
CPC .. H10D 30/014; H10D 30/43; H10D 30/6735; H10D 48/362; H10D 62/80; H10D 62/118; H10D 62/119; H10D 62/121; H10P 14/3436; H10P 14/3462
See application file for complete search history.

(56) References Cited

U.S. PATENT DOCUMENTS

2021/0134992 A1*    5/2021    Lu ...................... H10D 30/6757
2022/0199783 A1*    6/2022    Penumatcha .......... H10D 30/47
(Continued)

*Primary Examiner* — David C Spalla
(74) *Attorney, Agent, or Firm* — Essential Patents Group, LLP

(57) ABSTRACT

Devices, transistor structures, systems, and techniques are described herein related to field effect transistors having a doping layer on metal chalcogenide nanoribbons outside of the channel region. The doping layer is a metal oxide that shifts the electrical characteristics of the nanoribbons and is formed by depositing a metal and oxidizing the metal by exposure to ozone and ultraviolet light.

20 Claims, 15 Drawing Sheets

(51) Int. Cl.
    H10D 62/80     (2025.01)
    H10D 99/00     (2025.01)
    H10P 14/20     (2026.01)

(56)         References Cited

U.S. PATENT DOCUMENTS

2023/0008409 A1*   1/2023   Chou ................... H10D 62/118
2023/0099814 A1*   3/2023   Maxey ................... H10D 30/47
                                        257/29

* cited by examiner

408

409

413

415

503

504

BATTERY
615

605

606

Memory and/or Processor
having a 2D FET with a
Doping Material on the TMD
Outside of the Channel
650

INTEGRATED
SYSTEM
610

620

TO BATTERY

PMIC — 630

635          625

CONTROLLER          RFIC
TX/RX

TO
ANTENNA

IC Die Assembly having a
2D FET with a Doping
Material on the TMD
Outside of the Channel
640

660

610

TRANSISTOR STRUCTURES HAVING A DOPING LAYER ON TRANSITION METAL DICHALCOGENIDE LAYERS OUTSIDE OF THE CHANNEL REGION

BACKGROUND

Higher performance, lower cost, increased miniaturization, and greater density of integrated circuits (ICs) are ongoing goals of the electronics industry. To maintain the pace of increasing transistor density, for example, device dimensions must continue to shrink. However, the performance of silicon transistors drops significantly at reduced gate lengths, particularly in the context of gate-all-around (GAA) or nanoribbon transistors. In such devices, the reduced thickness of the silicon semiconductor has a detrimental impact on the mobility of the silicon material such that the devices become inoperable. 2D materials such as transition metal dichalcogenides (TMDs) offer a promising alternative to silicon in these applications. TMDs and similar materials are inherently very thin (e.g., about 1 nm) with extremely high mobilities. However, deployment of TMDs in transistor structures such as GAA and nanoribbon transistors faces numerous difficulties. It is with respect to these and other considerations that the present improvements have been needed. Such improvements may become critical as the desire to deploy TMDs in transistor structures becomes even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
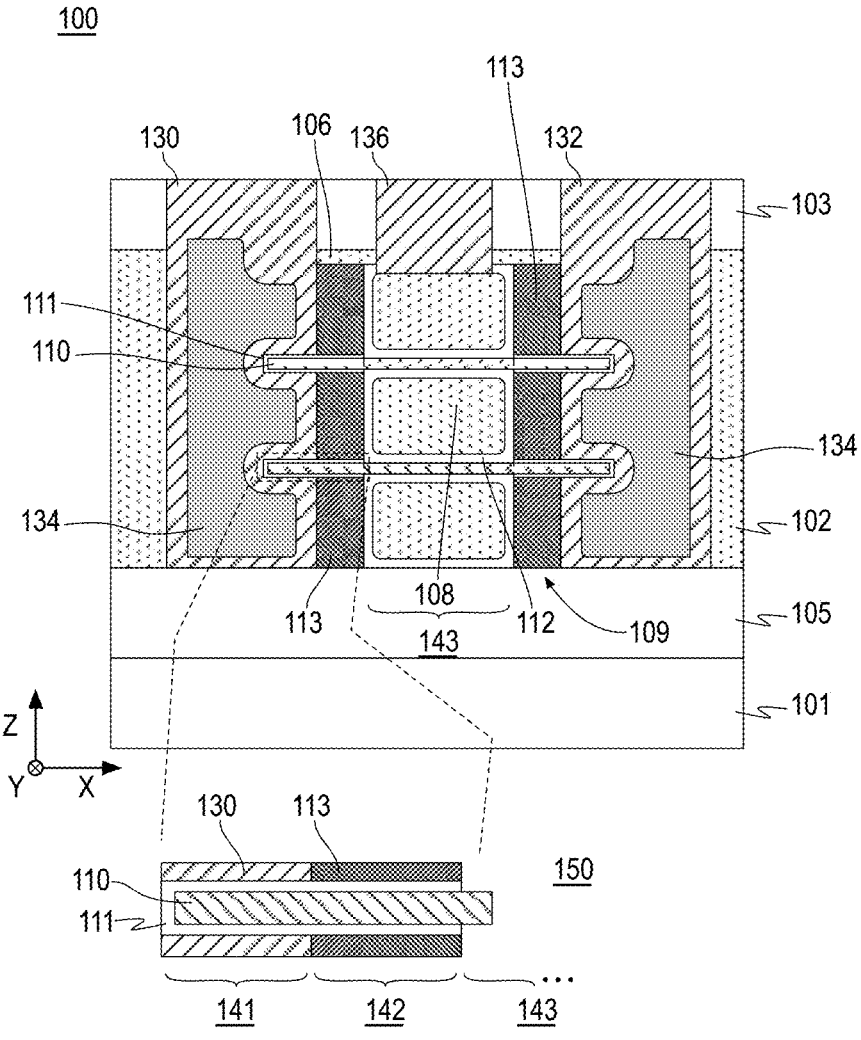
FIG. 1 illustrates a cross-sectional side view of a transistor structure having doping layers on non-channel regions of metal chalcogen layers of the transistor structure.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. Herein, the term "predominantly" indicates not less than 50% of a particular material or component while the term "substantially pure" indicates not less than 99% of the particular material or component and the term "pure" indicates not less than 99.9% of the particular material or component. Unless otherwise indicated, such material percentages are based on atomic percentage. Herein the term concentration is used interchangeably with material percentage and also indicates atomic percentage unless otherwise indicated.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Devices, transistor structures, integrated circuit dies, apparatuses, systems, and techniques are described herein related to the deployment of a doping layer on transition metal dichalcogenide layers outside of the channel region of the transition metal dichalcogenide layers.

As discussed, transition metal dichalcogenide (TMD) materials or similar materials may be deployed as the semiconductor in a transistor structure such as a gate-all-around (GAA), dual gate, or nanoribbon transistor. For example, TMD material layers may be deployed as a stack of nanoribbons in a transistor. In such contexts, it is necessary for the TMD material layer to be undoped in the channel region. However, it is desirable that the TMD material layer be doped outside of the channel region, such as at the source and drain regions of the TMD material layer, for improved contact resistance and conductivity. Currently, such doping may be provided by a global back-gate under the source and drain regions that applies electrostatic doping, by atomic doping of the TMD material, or by replacing the TMD material outside of the channel region (e.g., regrowth). However, a global back-gate is not plausible at scale due to process flow integration issues and other complications, atomic doping results in lower mobility, and replacing the TMD material layer offers processing difficulties, device reliability issues, and other problems. For example, GAA, dual gate, or nanoribbon field effect transistors (FETs) (i.e., 2D FETs) may not be able to supplant silicon FETs without a manufacturable, reliable doping strategy for the TMD material outside of the channel region.

In some embodiments, a TMD material is undoped in the channel region and doped in a region outside of channel region based on 2D doping control through Vt shifting. Such Vt shifting (or doping) is provided outside of the channel region by depositing a metal onto exposed regions of the TMD material and applying an ultraviolet light (UV) and ozone treatment to the deposited metal. This forms a non-stoichiometric metal oxide layer or film on the selected regions of the TMD material with tunable charge transfer characteristics. As used herein, the term non-stoichiometric metal oxide indicates the metal oxide material, layer, or film deviates from common stoichiometry. Notably, the non-stoichiometric metal oxide may be considered a material with a band structure such that the electron affinity of the material varies or is tuned based on its stoichiometry, which changes the density of charge carriers at the interface with the TMD material and, therefore, contact resistance. Notably, after deposition of the metal alone, in an IV (on current v. voltage) curve, the on current of the TMD material is drastically reduced. While not bound by theory, it is believed the on current is reduced due to scattering. However, after UV and ozone treatment to form the metal oxide, the on current increases to the point that the TMD material is in an always on state, evidencing a doping of the TMD material to a conductive state. Thereby, the TMD material is advantageously doped outside of the channel (e.g., it is conductive outside of the channel) while being undoped in the channel (e.g., it is a semiconductor in the channel). Such transistor structures improve contact resistance between the source and drain and the doped TMD material while offering gate control in the undoped channel region. These and other advantages will be evident based on the discussed embodiments.

In some embodiments, a transistor structure includes one or more material layers having a transition metal and a chalcogen, such that the material layers extend between source and drain structures of the transistor. In a channel region of each material layer, the material layer is undoped and is in direct contact with a gate structure. As used herein, the term channel region indicates a region of a material layer adjacent to a gate dielectric and gate electrode that is to be controlled by the gate electrode to switch the transistor structure in operation. Notably, a region of a material layer need not be in operation to be characterized as a channel region, channel material, or the like.

Outside of the channel region of the material layer, the material layer or at least a portion of the material layer is doped (or is doping controlled) by a doping layer on the material layer. As used herein, the term doping layer indicates a material layer that influences another material layer to alter its electrical characteristics such as conductivity. Notably, in the context of TMDs and similar materials such as 2D materials, the TMD material layer is not impurity doped. Instead, at the scale of TMD material layer (e.g., ~1 nm thick) such as molecular monolayer thicknesses, the materials around the TMD material layer influence the characteristics of the TMD material layer. While not bound by theory, by applying a doping layer (e.g., also at the nm scale, such as ~1 nm thick), the TMD material layer and the doping layer may act as a single quantum body such that the TMD material layer is effectively doped by the doping layer outside of the channel region. Although discussed herein in some contexts with respect to TMD material layers, the material layer of the transistor structure may be any suitable material such as a layer including a metal or transition metal and a chalcogen, as discussed further herein below.

FIG. 1 illustrates a cross-sectional side view of a transistor structure 100 having doping layers 111 on non-channel regions of metal chalcogen layers 110 of transistor structure 100, arranged in accordance with at least some implementations of the present disclosure. For example, a GAA transistor, dual gate transistor, or nanoribbon transistor includes a stack of nanoribbons such as metal chalcogen layers 110 that extend from a source structure 130 to a drain structure 132. Although illustrated with two nanoribbons, transistor structure 100 may include any number of nanoribbons such as three to five nanoribbons, or more. Furthermore, although discussed with respect to metal chalcogen layers 110 such that metal chalcogen layers 110 include a metal and a chalcogen, layers 110 may be any suitable material such as a 2D material. Such materials are discussed further herein below.

As shown, in a channel region 143 of each of metal chalcogen layers 110, control is provided by a gate structure 109 that includes a gate electrode 108 separated from metal chalcogen layers 110 by a gate dielectric 112. As discussed, a channel region indicates a region of each of metal chalcogen layers 110 adjacent to and controlled by gate structure 109 to switch transistor structure 100 in operation. As shown in enlarged view 150, metal chalcogen layers 110 also include source and drain contact regions 141 and a spacer region 142 that are outside of channel region 143. Source and drain contact regions 141 are immediately adjacent source structure 130 and drain structure 132 such that, absent doping layers 111, source structure 130 and drain structure 132 would otherwise contact metal chalcogen layers 110. Similarly, spacer region 142 is immediately adjacent spacer 113 such that, absent doping layers 111, spacer 113 would otherwise contact metal chalcogen layers 110.

Advantageously, metal chalcogen layers 110 are free of doping layers 111 in channel region 143 and doping layers 111 are directly on metal chalcogen layers 110 in one or both of source and drain contact regions 141 and spacer region 142. For example, in channel region 143, gate structure 109 is directly on metal chalcogen layers 110 and, in one or both of source and drain contact regions 141 and spacer region 142, doping layers 111 are directly on metal chalcogen layers 110. As discussed, doping layers 111 dope metal chalcogen layers 110 to alter the electrical characteristics of metal chalcogen layers 110 in source and drain contact regions 141 and/or spacer region 142 relative to that of metal chalcogen layers 110 in channel region 143. Notably, metal chalcogen layers 110 are advantageously undoped in channel region 143 while being doped in source and drain contact regions 141 and spacer region 142. The doping of metal chalcogen layers 110 in source and drain contact regions 141 and spacer region 142 may be provided by 2D doping control through Vt shifting, as discussed.

In some embodiments, one or more of metal chalcogen layers 110 includes a transition metal and a chalcogen. The transition metal may be any transition metal such as any element of groups 4 through 11, the group 3 elements scandium and yttrium, and the inner transition metals (e.g., f-block lanthanide and actinide series). The chalcogen may be any chalcogen such as group 16 elements, excluding oxygen. Notably advantageous transition metals are molybdenum and tungsten. Notably advantageous chalcogens are sulfur, selenium, and tellurium. In some embodiments, one or more of metal chalcogen layers 110 are stoichiometric TMDs. For example, one or more of metal chalcogen layers 110 may be $MoS_2$, $WS_2$, $MoSe_2$, $WSe_2$, $MoTe_2$, or $WTe_2$. In some embodiments, one or more of metal chalcogen layers 110 is a molecular monolayer (e.g., a monolayer of a transition metal and a chalcogen). In some embodiments, the molecular monolayer includes an atomic center transition metal layer and atomic chalcogen layers on both sides of the atomic center transition metal layer. In some embodiments, the molecular monolayer has a thickness of about 0.33 nm.

Although discussed with respect to a metal chalcogen layer or a TMD layer in some contexts, layers 110 may be a 2D material layer such as a monolayer. For example, one or more of layers 110 may be a monolayer sheet, a 2D channel material, a nanosheet, or a nanoribbon. In some embodiments, layers 110 may be semiconductor materials. In some embodiments, each of layers 110 include multiple stacked monolayer sheets. In some embodiments, one or more of layers 110 is a graphene-based (or graphene family) material such as graphene, hexagonal boron nitride (hBN, white graphene), boron and nitrogen co-doped graphene (BCN), fluorographene, or graphene oxide. In some embodiments, one or more layers 110 is a semiconducting dichalcogenide including a chalcogen and a metal such as one of the TMD materials discussed above. In some embodiments, one or more of layers 110 is one of $ZrS_2$ or $ZrSe_2$. In some embodiments, one or more of layers 110 is a 2D oxide such as a mica or a bismuth strontium calcium copper oxide (BSCCO) including $MoO_3$ or $WO_3$. In some embodiments, one or more of layers 110 is a 2D oxide such as a layered copper oxide including $TiO_2$, $MnO_2$, $V_2O_5$, $TaO_3$, $RuO_2$, or the like. In some embodiments, one or more of layers 110 is a 2D oxide such as a perovskite-type including $LaNb_2O_7$, $(Ca,Sr)_2Nb_3O_{10}$, $Bi_4Ti_3O_{12}$, $Ca_2Ta_2TiO_{10}$, or the like. In some embodiments, one or more of the layers 110 is a 2D oxide such as a hydroxide including $Ni(OH)_2$ or $Eu(OH)_2$ or the like.

Doping layers 111 may also be characterized as material layers and, in some embodiments, one or more of doping layers 111 is a metal oxide. For example, doping layers 111 may include oxygen and a metal. The metal may be any suitable metal that provides, when in metal oxide form, doping to the 2D material. In some embodiments, the metal is one of germanium, aluminum, lanthanum, magnesium, niobium, gallium, antimony, scandium, yttrium, gadolinium, molybdenum, or tungsten. For example, one or more of doping layers 111 may be one of germanium oxide, aluminum oxide, lanthanum oxide, magnesium oxide, niobium oxide, gallium oxide, antimony oxide, scandium oxide, yttrium oxide, gadolinium oxide, molybdenum oxide, or tungsten oxide. In some embodiments, one or more of doping layers 111 are a non-stoichiometric metal oxide layer, as discussed above. For example, a non-stoichiometric metal oxide layer or film deviates from common stoichiometry and, on the selected regions of metal chalcogen layers, provides tunable charge transfer characteristics. A non-stoichiometric metal oxide layer may have any stoichiometry that deviates from the common stoichiometry of the metal oxide material. In some embodiments, the metal of the metal oxide forms a metal oxide with different stoichiometries and therefore different metal oxidation states: germanium (+2, +4), niobium (+5, +4, +3), antimony (+3 and +5), molybdenum (+2, +3, +4, +5, +6), or tungsten (+2, +3, +4, +5, +6). However, any of the metal oxides listed above may be used in doping layers 111.

In various embodiments, transistor structure 100 is an n-type metal oxide semiconductor (NMOS) device or a p-type metal oxide semiconductor (PMOS) device. In some embodiments, an NMOS device and a PMOS device may be integrated in an integrated circuit (IC) device or die. Advantageously, when metal chalcogen layers 110 are p-type, doping layers 111 provide p-type doping and when metal chalcogen layers 110 are n-type, doping layers 111 provide n-type doping. For example, n-type doping layers 111 include lanthanum oxide, magnesium oxide, scandium oxide, yttrium oxide, and gadolinium oxide. P-type doping layers 111 include germanium oxide, aluminum oxide, niobium oxide, aluminum oxide, and gallium oxide.

In some embodiments, metal chalcogen layers 110 are n-type such as $MoS_2$ or $WS_2$ and doping layers 111 include one of lanthanum oxide, magnesium oxide, scandium oxide, yttrium oxide, and gadolinium oxide. For example, the transition metal of metal chalcogen layers 110 may be molybdenum or tungsten, the chalcogen of metal chalcogen layers 110 maybe sulfur, and the metal of doping layers 111 may be one of lanthanum, magnesium, scandium, yttrium, or gadolinium.

In some embodiments, metal chalcogen layers 110 are p-type such as $MoS_2$, or $WS_2$, and doping layers 111 include one of germanium oxide, aluminum oxide, niobium oxide, aluminum oxide, or gallium oxide. For example, the transition metal of metal chalcogen layers 110 may be molybdenum or tungsten, the chalcogen of metal chalcogen layers 110 maybe selenium, and the metal of doping layers 111 may be one of germanium, aluminum, niobium, aluminum, or gallium.

Metal chalcogen layers 110 and doping layers 111 may have any suitable thicknesses. In some embodiments, metal chalcogen layers 110 each have a thickness of not more than 1 nm. In some embodiments, metal chalcogen layers 110 each have a thickness of about 0.33 nm. Similarly, doping layers 111 may have a thickness at the nm scale. In some embodiments, doping layers 111 each have a thickness of not more than 1 nm.

Returning to discussion of transistor structure 100 with respect to FIG. 1, as shown, transistor structure 100 includes a substrate 101 and an optional dielectric layer 105. Substrate 101 may include any suitable material or materials. For example, substrate 101 may be a substrate substantially aligned along a predetermined crystal orientation (e.g., <100>, <111>, <110>, or the like). In some embodiments, substrate 101 is a semiconductor material such as monocrystalline silicon (Si), germanium (Ge), silicon germanium (SiGe), a III-V materials-based material (e.g., gallium arsenide (GaAs)), a silicon carbide (SiC), a sapphire $(Al_2O_3)$, or any combination thereof. In some embodiments, substrate 101 is silicon having a <111> crystal orientation. In various embodiments, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. Optional dielectric layer 105 may act as an etch stop and may include any suitable material such as silicon oxide, silicon nitride, or silicon carbide. As shown, transistor structure 100 further includes a gate contact 136 coupled to gate electrode 108. Also, structures or components of transistor structure 100 may be embedded within dielectric materials 102, 103, 106.

Transistor structure 100 further includes a source structure 130 and a drain structure 132, which may be a source contact metal and a drain contact metal, respectively. Source and drain structures may further includes a fill metal 134. Source structure 130 and drain structure 132 may include any suitable conductive material such as antimony, ruthenium, titanium, or others. Fill metal 134 may include any suitable fill metal such as cobalt, tungsten, copper, ruthenium, or others. As shown, source structure 130 and drain structure 132 are directly on doping layers 111 in source and drain contact regions 141. By providing doping layers 111 on source and drain contact regions 141 of metal chalcogen layers 110, transistor structure 100 has improved contact resistance and conductivity in source and drain contact regions 141.

Source structure 130 and drain structure 132 are separated from gate structure 109 by spacer 113. Spacer 113 may include any suitable insulative material or materials such as low k dielectric material. As shown, spacer 113 is directly on doping layers 111 in spacer region 142 of metal chalcogen layers 110. By providing doping layers 111 in spacer region 142 of metal chalcogen layers 110, transistor structure 100 has improved conductivity in spacer region 142.

Therefore, by providing doping layers 111 directly on metal chalcogen layers 110 in the source contact region illustrated as source or drain contact regions 141 and spacer region 142, transistor structure 100 has improved conductivity while not impacting device performance in channel region 143 of metal chalcogen layers 110.

As discussed, transistor structure 100 includes a stack of metal chalcogen layers 110 (e.g., first material layers or nanoribbons) such that one or more of metal chalcogen layers 110 includes a transition metal and a chalcogen. Each of metal chalcogen layers 110 has channel region 143 and source or drain contact regions 141 and/or spacer region 142 outside of channel region 143. Transistor structure 100 also includes gate structure 109 directly on channel region 143 of each of metal chalcogen layers 110, source structure 130 and drain structure 132 coupled to each of metal chalcogen layers 110, and spacer 113 between gate structure 109 and each of source structure 130 and drain structure 132. As shown, doping layers 111 (e.g., second material layers) are directly on one or both of source and drain region 141 and spacer region 142 of metal chalcogen layers 110, such that source and drain region 141 and spacer region 142 are between channel region 143 and one of source structure 130 and drain structure 132. As discussed, doping layers 111 include oxygen and a metal such that doping layers 111 are a metal oxide formed, for example, by UV and ozone treatment of a deposited metal layer.

In the embodiment of FIG. 1, doping layers 111 are on metal chalcogen layers 110 in both source and drain region 141 and in spacer region 142. In some embodiments, different doping layers may be utilized on source and drain region 141 and on spacer region 142.

Figure 2:
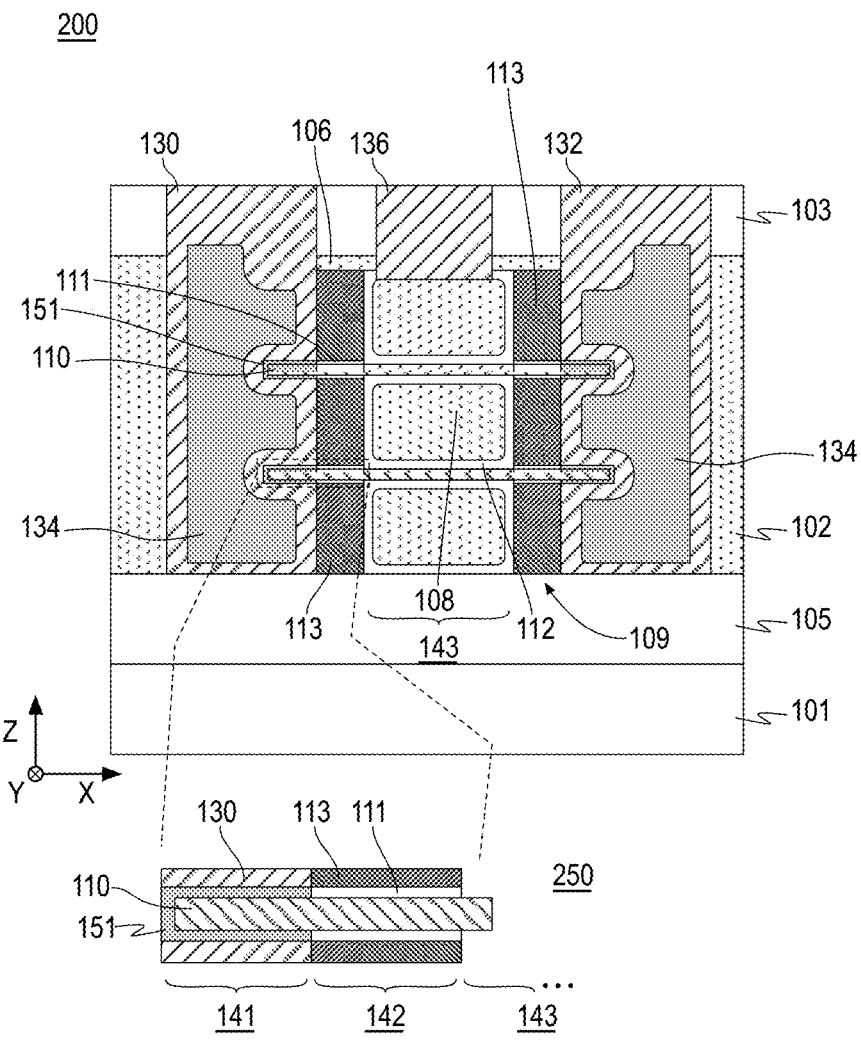
FIG. 2 illustrates a cross-sectional side view of a transistor structure having different doping layers on source and drain regions and spacer regions, respectively, of metal chalcogen layers of the transistor structure.

FIG. 2 illustrates a cross-sectional side view of a transistor structure 200 having different doping layers 111, 151 on source and drain regions 141 and spacer regions 142, respectively, of metal chalcogen layers 110 of transistor structure 200, arranged in accordance with at least some implementations of the present disclosure. In FIG. 2, and elsewhere herein, like numerals indicate like components, and such components may have any characteristics discussed herein. In the embodiment of FIG. 2, as shown in enlarged view 250, different doping layers are utilized on source and drain region 141 and on spacer region 142. Such embodiments may offer the advantages of increased flexibility and performance tuning. For example, application of doping layers 111, 151 on metal chalcogen layers 110 also alter the work function of the region on which the doping layers 111, 151 are applied. By applying different doping layers 111, 151, the work function in source and drain region 141 may be optimized, for example, for contact by source structure 130 and drain structure 132. In some embodiments, a doping material optimized for work function considerations is applied on metal chalcogen layers 110 in source and drain region 141 and a doping material optimized for Vt shift (e.g., manipulation of metal chalcogen layers 110) is applied on metal chalcogen layers 110 in spacer region 142. In the context of transistor structure 200 different doping layers are deployed by providing different metal oxides. For example, doping layers 111 may include oxygen and a first metal and doping layers 151 include oxygen and a second metal different than the first metal.

Doping layers 151 may have any characteristics discussed with respect to doping layers 111. For example, doping layers 151 may also be characterized as material layers and, in some embodiments, one or more of doping layers 151 is a metal oxide such as a non-stoichiometric metal oxide layer, as discussed above. For example, doping layers 151 may be one or more of germanium oxide, aluminum oxide, lanthanum oxide, magnesium oxide, niobium oxide, gallium oxide, antimony oxide, scandium oxide, yttrium oxide, gadolinium oxide, molybdenum oxide, or tungsten oxide. In some embodiments, such layers have oxidation states discussed above with respect to doping layers 111. In some embodiments, doping layers 151 include oxygen and a metal such as germanium, aluminum, lanthanum, magnesium, niobium, gallium, antimony, scandium, yttrium, gadolinium, molybdenum, or tungsten.

As discussed, in various embodiments, transistor structure 100 may be an NMOS device or PMOS device. In some embodiments, when metal chalcogen layers 110 are p-type, both of doping layers 111 and doping layers 151 provide p-type doping and when metal chalcogen layers 110 are n-type, both of doping layers 111 and doping layers 151 provide n-type doping. As discussed, n-type doping layers 111 include lanthanum oxide, magnesium oxide, scandium oxide, yttrium oxide, and gadolinium oxide. P-type doping layers 111 include germanium oxide, aluminum oxide, niobium oxide, aluminum oxide, and gallium oxide.

In some embodiments, metal chalcogen layers 110 are n-type such as $MoS_2$ or $WS_2$ and doping layers 111 include one of lanthanum oxide, magnesium oxide, scandium oxide, yttrium oxide, and gadolinium oxide, and doping layers 151 include another of lanthanum oxide, magnesium oxide, scandium oxide, yttrium oxide, and gadolinium oxide. For example, the transition metal of metal chalcogen layers 110 may be molybdenum or tungsten, the chalcogen of metal chalcogen layers 110 maybe sulfur, the metal of doping layers 111 may be one of lanthanum, magnesium, scandium, yttrium, or gadolinium, and the metal of doping layers 151 may be another of lanthanum, magnesium, scandium, yttrium, or gadolinium.

In some embodiments, metal chalcogen layers 110 are p-type such as $MoS_2$, or $WSe_2$ and doping layers 111 include one of germanium oxide, aluminum oxide, niobium oxide, aluminum oxide, or gallium oxide, and doping layers 151 include another of germanium oxide, aluminum oxide, niobium oxide, aluminum oxide, or gallium oxide. For example, the transition metal of metal chalcogen layers 110 may be molybdenum or tungsten, the chalcogen of metal chalcogen layers 110 maybe selenium, the metal of doping layers 111 may be one of germanium, aluminum, niobium, aluminum, or gallium, and the metal of doping layers 111 may be another of germanium, aluminum, niobium, aluminum, or gallium.

As discussed, transistor structure 200 includes a stack of metal chalcogen layers 110 (e.g., first material layers or nanoribbons) such that one or more of metal chalcogen layers 110 includes a transition metal and a chalcogen. Transistor structure 100 also includes gate structure 109 directly on channel region 143 of each of metal chalcogen layers 110, source structure 130 and drain structure 132 coupled to each of metal chalcogen layers 110, and spacer 113 between gate structure 109 and each of source structure 130 and drain structure 132. As shown, doping layers 111 (e.g., second material layers) are directly on source and drain region 141 of metal chalcogen layers 110 and doping layers 151 (e.g., third material layers) are directly on spacer region 142 of metal chalcogen layers 110, such that source and drain region 141 and spacer region 142 are between channel region 143 and one of source structure 130 and drain structure 132. Furthermore, spacer region 142 is between channel region 143 and source and drain region 141. As discussed, doping layers 111 include oxygen and a first metal and doping layers 151 include oxygen and a second metal. In some embodiments, the first metal comprises one of lanthanum, magnesium, scandium, yttrium, or gadolinium, and the second metal comprises another of lanthanum, magnesium, scandium, yttrium, or gadolinium. In some embodiments, the first metal comprises one of germanium, aluminum, niobium, aluminum, or gallium, and the second metal comprises another of germanium, aluminum, niobium, aluminum, or gallium.

Figure 3:
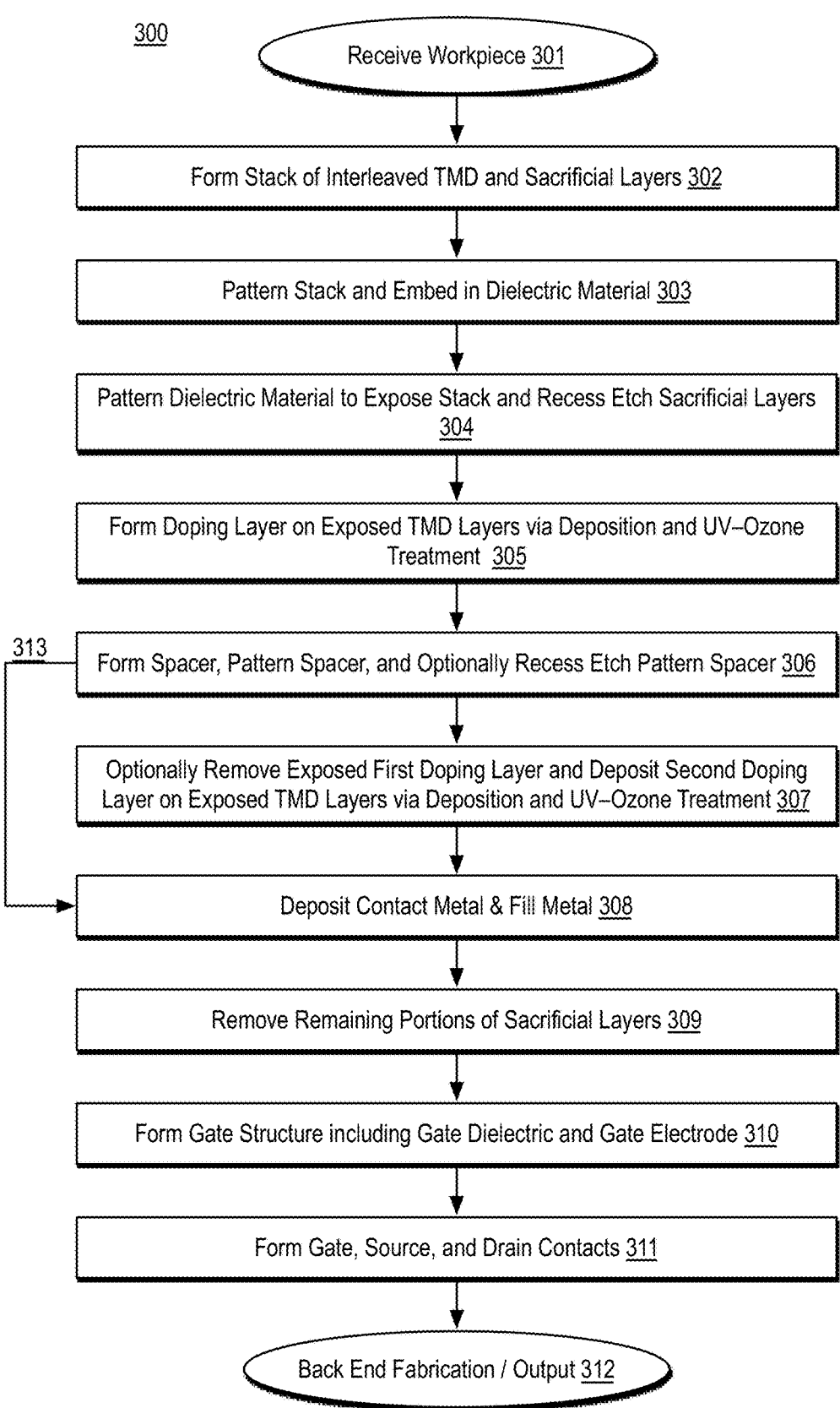
FIG. 3 is a flow diagram illustrating methods for forming a transistor structure having doping layers on non-channel regions of metal chalcogen layers of the transistor structure.

FIG. 3 is a flow diagram illustrating methods 300 for forming a transistor structure having doping layers on non-channel regions of metal chalcogen layers of the transistor structure, arranged in accordance with some embodiments of the disclosure. Methods 300 may be practiced, for example, to fabricate any transistor structure discussed herein. FIGS. 4A, 4B, 4C, 4D, 4E, 4F, 4G, 4H, 4I, 4J, 4K, 4L, and 4M are cross-sectional views of transistor structures having a single doping layer on metal chalcogen layers of the transistor structure evolving as methods 300 are practiced, arranged in accordance with some embodiments of the disclosure. FIGS. 5A, 5B, 5C, 5D, and 5E are cross-sectional views of transistor structures having different doping layers on metal chalcogen layers of the transistor structure evolving as methods 300 are practiced, arranged in accordance with some embodiments of the disclosure.

Methods 300 begin at input operation 301, where a workpiece is received for processing. For example, any substrate discussed herein may be received for processing. The substrate may include an optional dielectric layer or etch stop layer. Processing continues at operation 302, where a multilayer stack is formed. The multilayer stack includes a number material layers (e.g., metal chalcogen layers) interleaved with sacrificial layers. An optional hard mask layer may be formed over the interleaved layers. The materials of the multilayer stack may be formed using any suitable technique or techniques such as deposition techniques including atomic layer deposition (ALD), chemical vapor deposition (CVD), plasma enhanced chemical vapor deposition (PECVD), or metal-organic chemical vapor deposition (MOCVD) by layer transfer techniques. In some embodiments, the sacrificial layers are formed using CVD and the material layers are formed using MOCVD.

Figures 4A, 4B:
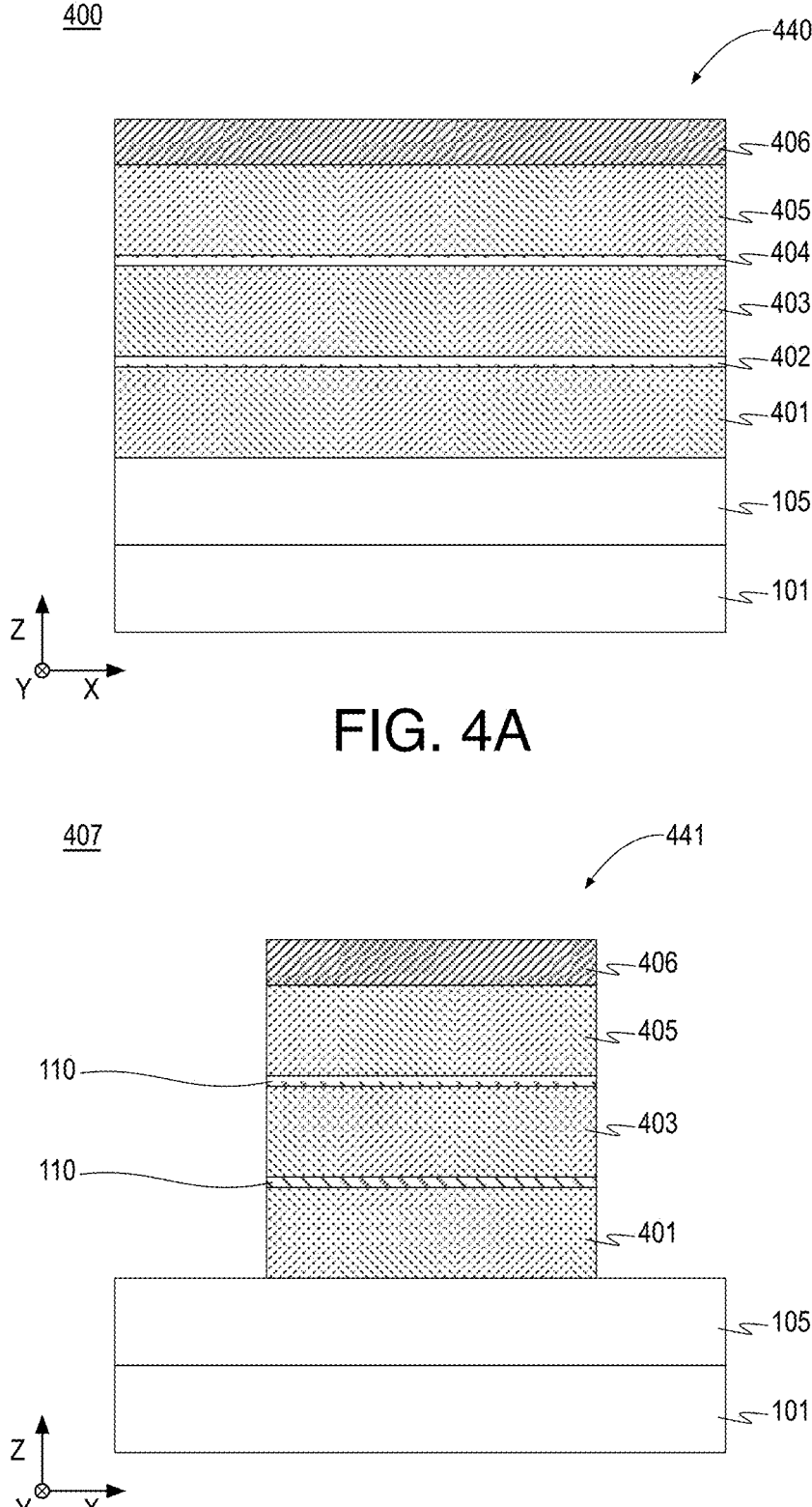
FIGS. 4A, 4B, 4C, 4D, 4E, 4F, 4G, 4H, 4I, 4J, 4K, 4L, and 4M are cross-sectional views of transistor structures having a single doping layer on metal chalcogen layers of the transistor structure evolving as the methods of FIG. 3 are practiced.

FIG. 4A illustrates a cross-sectional side view of a transistor structure 400 including a multilayer stack 440 formed over a substrate 101 and optional dielectric layer 105. As shown, multilayer stack 440 includes of a number of material layers 402, 404 interleaved with a number of sacrificial layers 401, 403, 405. Also as shown, multilayer stack 440 includes an optional hardmask layer 406. Material layers 402, 404 may be any materials discussed herein with respect to layers 110. Sacrificial layers 401, 403, 405 may be any material that may be etched or removed selectively with respect to material layers 402, 404. In some embodiments, sacrificial layers 401, 403, 405 are one of silicon oxide, aluminum oxide, or molybdenum oxide. In some embodiments, hardmask layer 406 is silicon carbide. Material layers 402, 404, sacrificial layers 401, 403, 405, hardmask layer 406 may be formed using ALD, CVD, PECVD, MOCVD, or the like.

Returning to FIG. 3, processing continues at operation 303, where the multilayer stack formed at operation 302 is patterned and the patterned multilayer stack is embedded in dielectric material. The multilayer stack may be patterned using any suitable technique or techniques such as lithography and etch techniques. The dielectric material that the patterned multilayer stack is embedded in may be formed using any suitable technique or techniques such as bulk deposition of a dielectric such as silicon nitride followed by planarization.

FIG. 4B illustrates a cross-sectional side view of a transistor structure 407 similar to transistor structure 400 after patterning multilayer stack 440 to form a patterned multilayer stack 441. In some embodiments, a patterned photoresist layer is formed on hardmask layer 406 and etch techniques are used to form the pattern of multilayer stack 440. In some embodiments, the pattern of the photoresist layer is first transferred to hardmask layer 406 and then to the remainder of multilayer stack 440 to form patterned multilayer stack 441. In some embodiments, dielectric layer 105 acts as an etch stop layer. As shown, such patterning may define metal chalcogen layers 110, which are part of patterned multilayer stack 441.

Figure 4C:
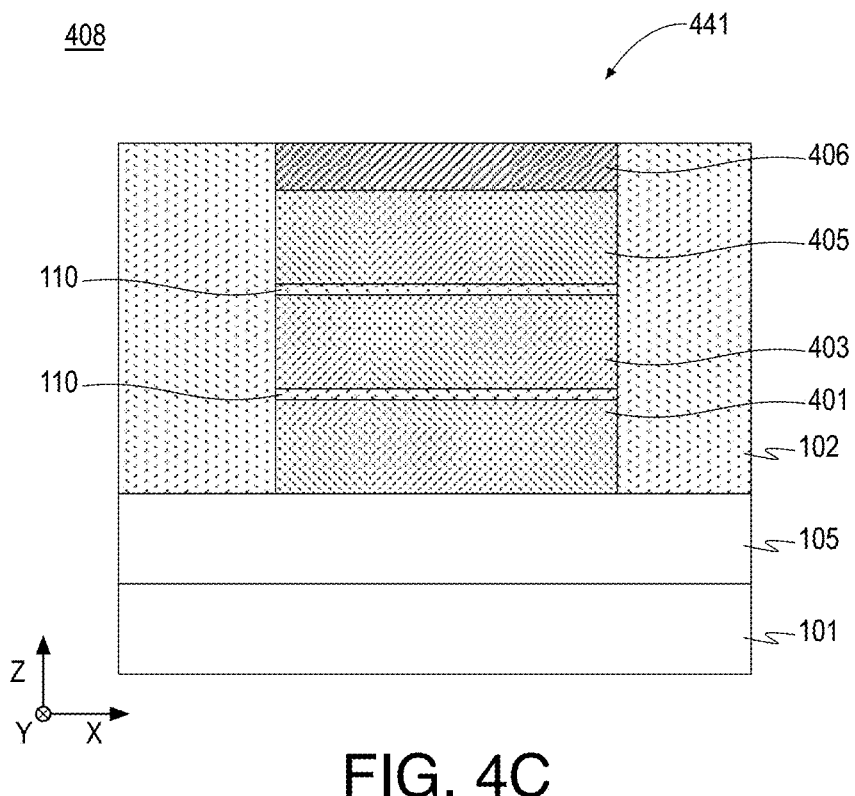

FIG. 4C illustrates a cross-sectional side view of a transistor structure 408 similar to transistor structure 407 after the formation of dielectric material 102. In some embodiments, the photoresist layer is removed and a bulk dielectric material is formed over patterned multilayer stack 441. Planarization (e.g., chemical mechanical polishing) is then performed to expose patterned multilayer stack 441 and to embed it in dielectric material 102.

Returning to FIG. 3, processing continues at operation 304, where the dielectric material formed at operation 304 is patterned to expose the source and drain ends of the embedded multilayer stack, and a selective recess etch is performed on the sacrificial layers of the multilayer stack to expose portions of the material layers of interest. Notably, it is desirable to dope the exposed portions form improved contact resistance and conductivity characteristics as discussed herein. The dielectric material may be patterned using any suitable technique or techniques such as photolithography at etch techniques. The recess etch may be performed by selective wet etch or atomic layer etch (ALE) or the like.

Figure 4D:
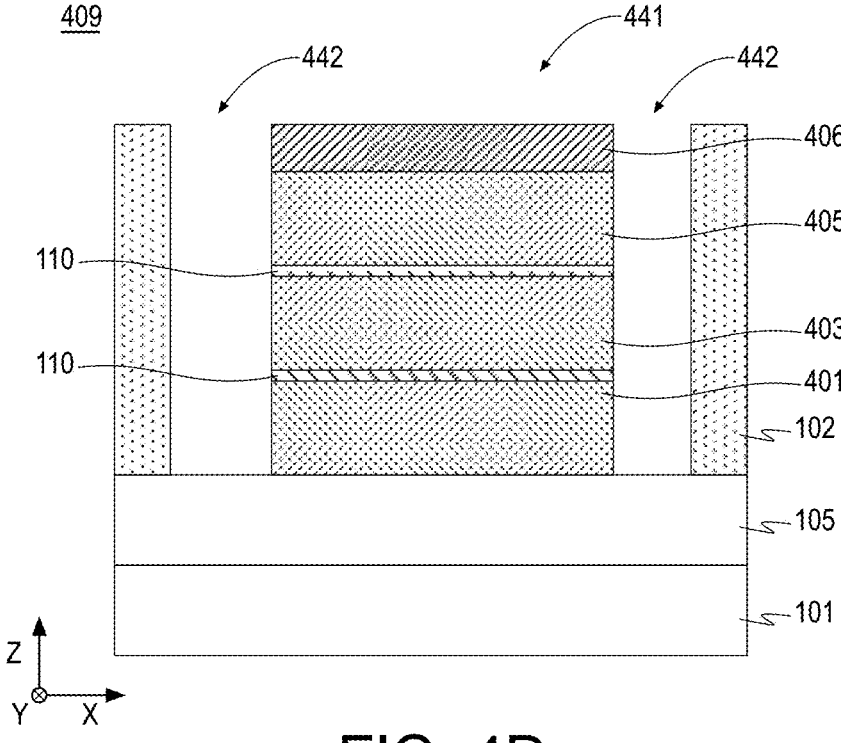

FIG. 4D illustrates a cross-sectional side view of a transistor structure 409 similar to transistor structure 408 after the patterning of dielectric material 102 to form openings 442 that reveal source and drain ends of patterned multilayer stack 441. In some embodiments, a patterned photoresist layer is formed on the planar top surfaces of patterned multilayer stack 441 and dielectric material 102, and etch techniques are used to form openings 442.

Figures 4E, 4F:
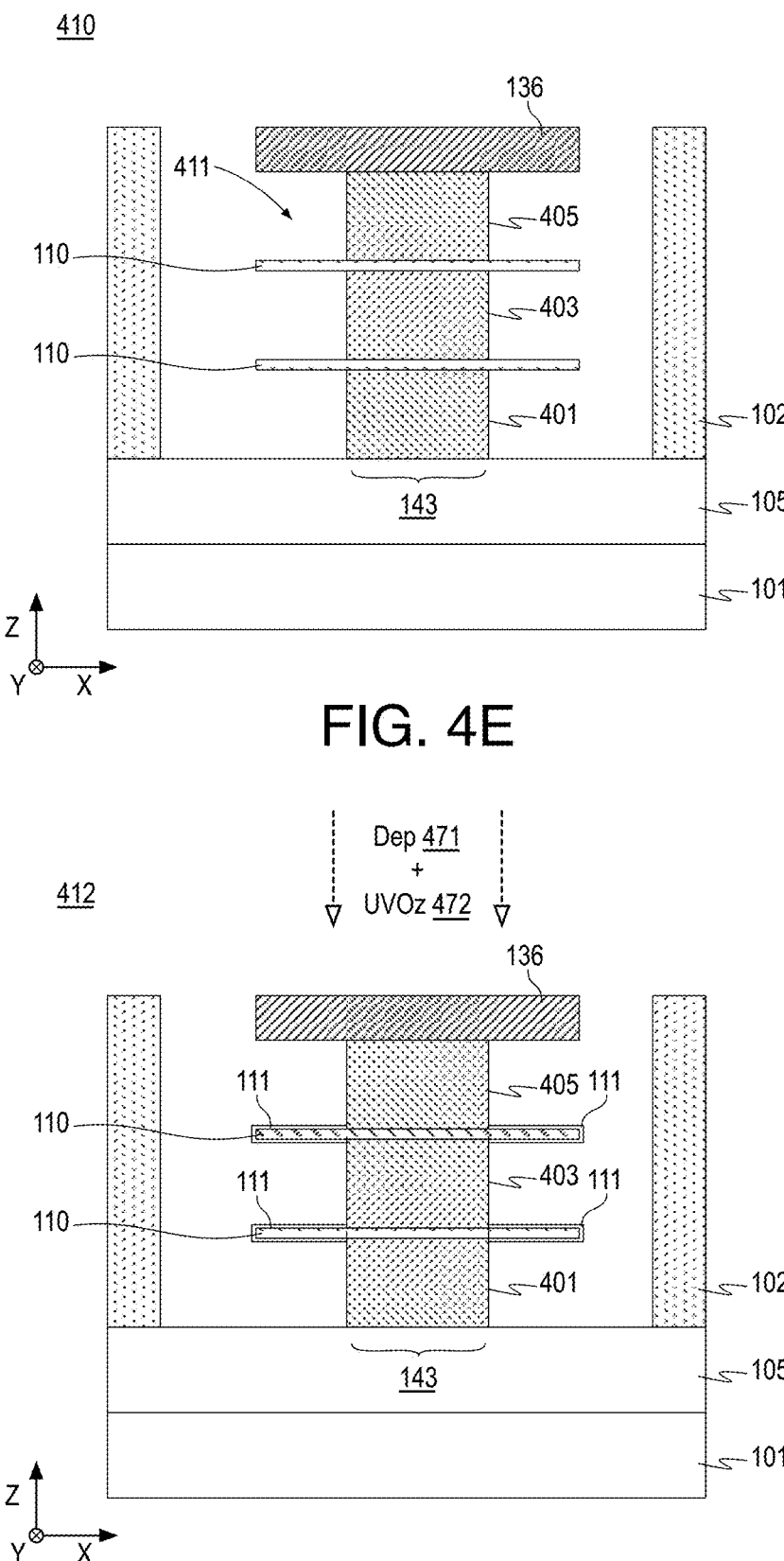

FIG. 4E illustrates a cross-sectional side view of a transistor structure 410 similar to transistor structure 409 after a recess etch reveals portions 411 of metal chalcogen layers 110. The recess etch may include selective wet etch or ALE techniques. Notably, the recess etch defines channel region 143. As discussed, it is advantageous to dope metal chalcogen layers 110 outside of channel region 143.

Returning to FIG. 3, processing continues at operation 305, where a doping layer is formed on the exposed portions of each of the material layers (e.g., metal chalcogen layers) by deposition of a metal followed by UV-ozone treatment. The doping layer may include any characteristics discussed herein. In some embodiments, a metal layer such as a pure metal layer is formed on the exposed portions of each of the material layers. The metal layer may be deposited using any suitable technique or techniques such as ALD, CVD, PECVD, MOCVD. The metal deposition may be selective to the exposed portions of each of the material layers or it may be formed on other exposed surfaces. Following the metal layer deposition, a UV-ozone treatment is provided to form a non-stoichiometric metal oxide layer or film. For example, a UV-ozone treatment includes exposing the metal layer to ozone (e.g., providing an ozone environment) while simultaneously exposing the metal layer to UV light (e.g., shining UV light directly on the metal layer).

FIG. 4F illustrates a cross-sectional side view of a transistor structure 412 similar to transistor structure 410 after formation of doping layers 111 on non-channel regions of metal chalcogen layers 110 via metal deposition operation 471 followed by UV-ozone treatment operation 472. As discussed, a metal layer may first be formed at metal deposition operation 471 using CVD, PECVD, MOCVD, or other techniques. Doping layers 111 are then formed via oxidation of the metal layer at UV-ozone treatment operation 472. In some embodiments, UV-ozone treatment operation 472 includes exposing the metal layer to an ozone environment and UV light simultaneously. Doping layers 111 may have any characteristics discussed elsewhere herein.

Returning to FIG. 3, processing continues at operation 306, where a spacer material is deposited, the spacer material is patterned, and the spacer material is optionally recessed. The spacer material may be formed using any suitable technique or techniques. For example, the spacer material may be bulk deposited followed by planarization. In some embodiments, the spacer material is a low k dielectric material such as hafnium oxide. The spacer material is then patterned to expose the source and drain ends of the embedded multilayer stack, and a selective recess etch may be performed on the spacer material to expose portions of the material layers of interest. The dielectric material may be patterned using any suitable technique or techniques such as photolithography at etch techniques. The recess etch may be performed by selective wet etch or ALE. Notably, it may be desirable to expose larger regions of the material layers for landing contact metal.

Figure 4G:
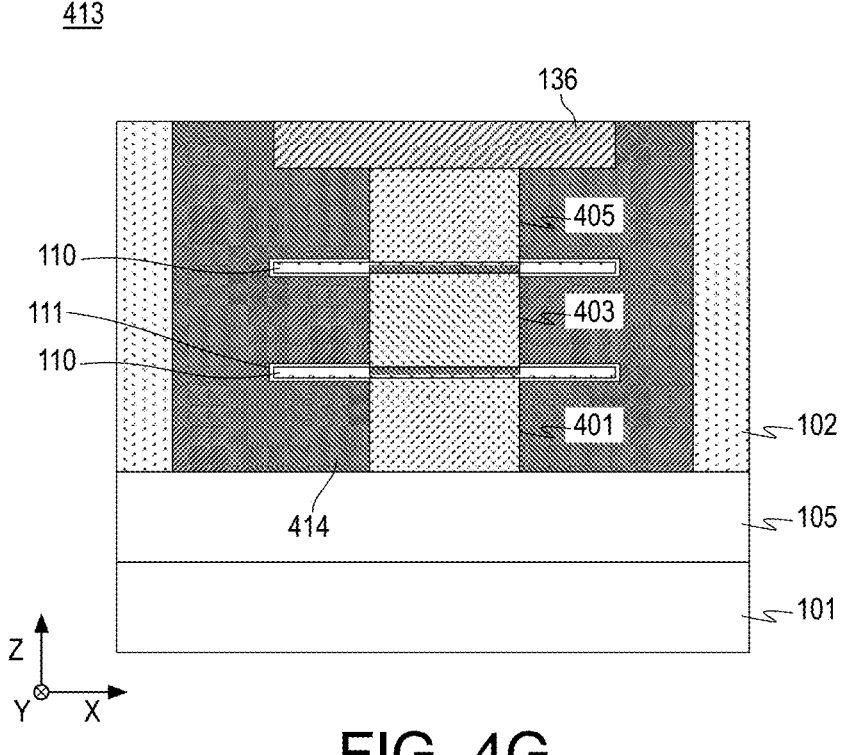

FIG. 4G illustrates a cross-sectional side view of a transistor structure 413 similar to transistor structure 412 after formation of spacer material 414. In some embodiments, a bulk spacer material is formed and planarization techniques are used to provide a substantially coplanar top surface. Spacer material 414 may be a low k dielectric material, for example, such as a carbon doped silicon oxide.

Figure 4H:
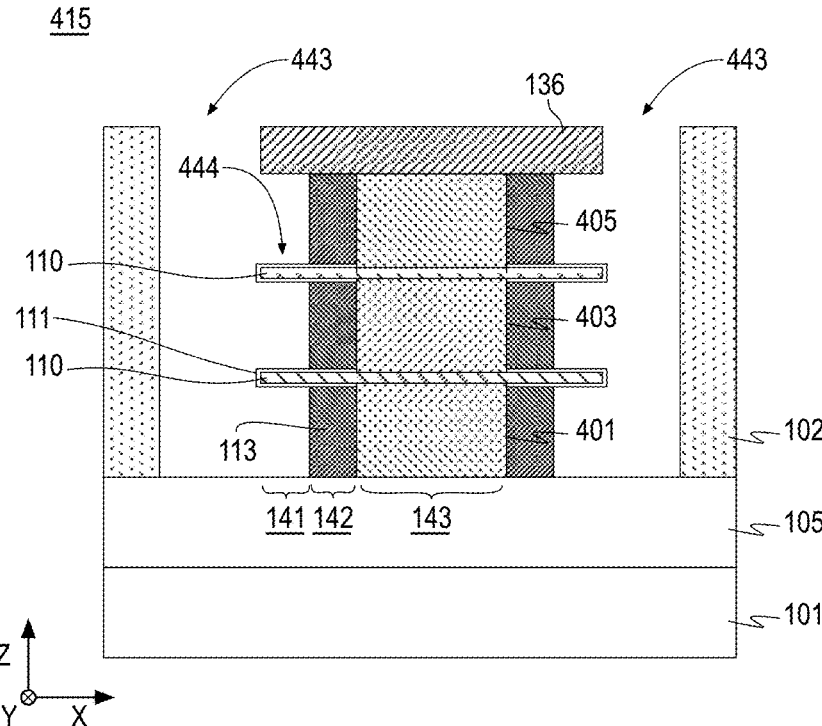

FIG. 4H illustrates a cross-sectional side view of a transistor structure 415 similar to transistor structure 413 after the patterning of spacer material 414 to form openings 443 and after a recess etch to further reveal portions 444 of metal chalcogen layers 110 having doping layers 111. In some embodiments, a patterned photoresist layer is formed on the planar top surface of transistor structure 413, and etch techniques are used to form openings 442. A subsequent recess etch, such as a selective wet etch or ALE, then reveals portions 444 of metal chalcogen layers 110 having doping layers 111. Notably, such processing defines source and drain contact regions 141 and spacer region 142. As discussed, it is advantageous to having doping layers 111 on metal chalcogen layers 110 in source and drain contact regions 141 and spacer region 142.

Returning to FIG. 3, as discussed, the newly exposed regions of the material layers were doped at operation 305. In some embodiments, processing continues at operation 308 via bypass 313 such that a single doping layer is used. In other embodiments, the newly exposed regions may be differentially doped with respect to the doping layer formed at operation 305. Such embodiments are discussed herein below with respect to operation 307 and FIGS. 5A to 5E.

Continuing now with single doping layer embodiments, processing continues from operation 306 at operation 308, where a source and drain contact metal and subsequent fill metal are formed. In some embodiments, the source and drain contact metal are applied using ALD or PVD. The source and drain contact metal may include any suitable metal such as those that provide a suitable work function and low contact resistance. In some embodiments, the source and drain contact metal includes one or more of antimony, bismuth, ruthenium, cobalt, copper, tungsten, gold, silver, or palladium. The fill metal or backfill metal may then be formed using any suitable technique or techniques such as electroplating followed by planarization processing. The fill metal may be any suitable conductive metal such as one or more of cobalt, tungsten, copper, or ruthenium.

Figure 4I:
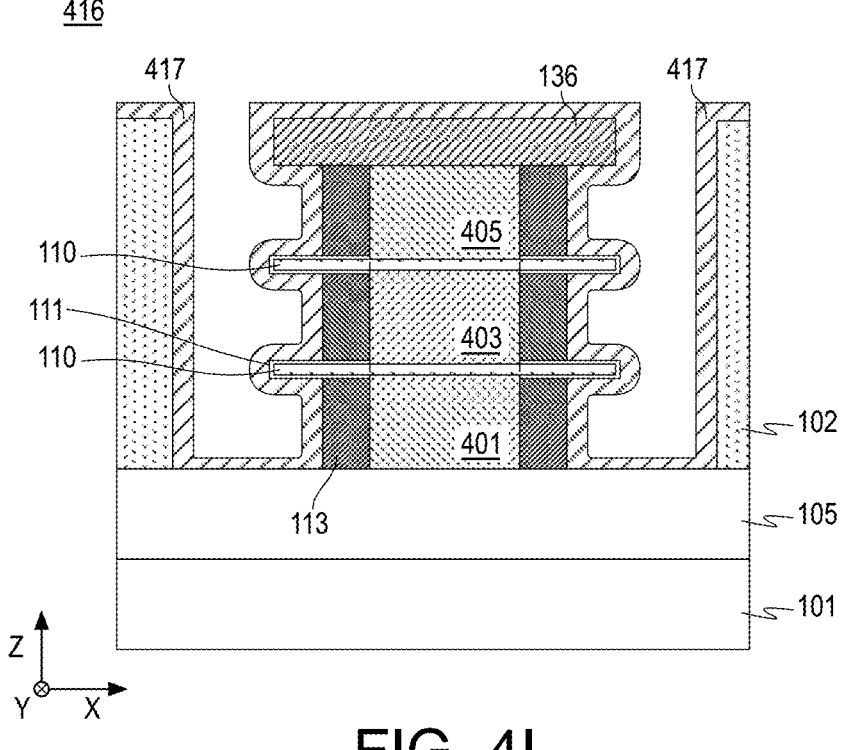

FIG. 4I illustrates a cross-sectional side view of a transistor structure 416 similar to transistor structure 415 after the deposition of source and drain contact metal 417. As shown, source and drain contact metal 417 may be substantially conformal to exposed surfaces of transistor structure 415.

Figure 4J:
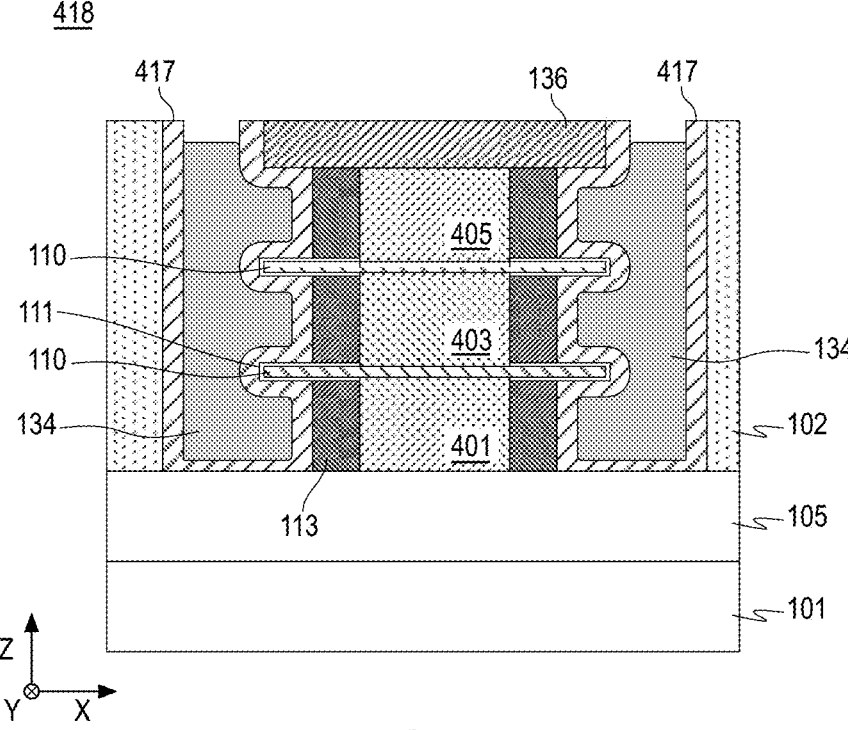

FIG. 4J illustrates a cross-sectional side view of a transistor structure 418 similar to transistor structure 416 after the bulk metal or backfill metal is deposited and planarization processing is deployed to form fill metal 134. In some embodiments, fill metal 134 may be recessed with respect to source and drain contact metal 417.

Returning to FIG. 3, processing continues at operation 309, where remaining portions of the sacrificial layers of the multilayer stack are removed. In some embodiments, a patterned photoresist layer is formed and etch techniques are used to selectively expose the sacrificial layers of the multilayer stack, and the photoresist layer is then removed. The exposed sacrificial layers may then be removed using selective etch techniques.

Figure 4K:
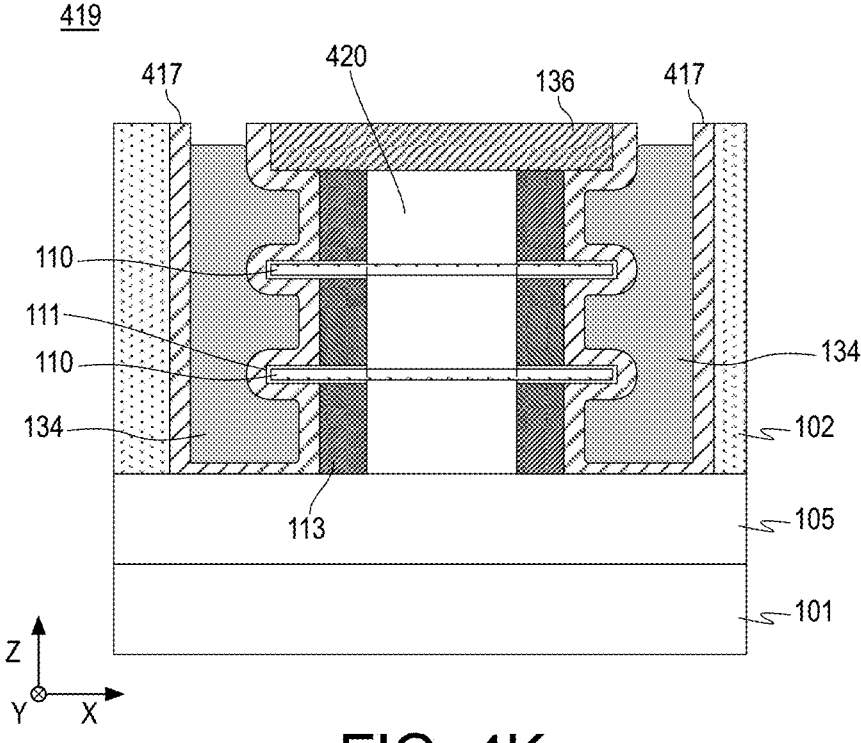

FIG. 4K illustrates a cross-sectional side view of a transistor structure 419 similar to transistor structure 418 after the removal of the remaining portions of sacrificial layers 401, 403, 405 to provide gate structure openings 420. In some embodiments, access to sacrificial layers 401, 403, 405 is provided by patterned openings in dielectric material 102 that are into or out of the page (i.e., in the positive or negative y-dimension) relative to the view shown in FIG. 4K. Sacrificial layers 401, 403, 405 are then removed by selective wet etch techniques. As shown, metal chalcogen layers 110 are free standing but supported by spacer 113, source and drain contact metal 417, and fill metal 134.

Returning to FIG. 3, processing continues at operation 310, where gate structures are formed within the openings vacated by the removal of the remaining portions of the sacrificial layers at operation 309. In some embodiments, the gate structure includes a gate dielectric layer and gate electrode. The gate dielectric layer may be formed by conformal deposition using ALD, for example. Similarly, the gate electrode (e.g., gate metal) may be formed using deposition techniques including ALD, plating techniques, or the like. In some embodiments, both the gate dielectric layer and the gate electrode are formed using the access openings formed at operation 309. Such gate dielectric layer and gate electrode deposition may then be followed by planarization techniques.

Figure 4L:
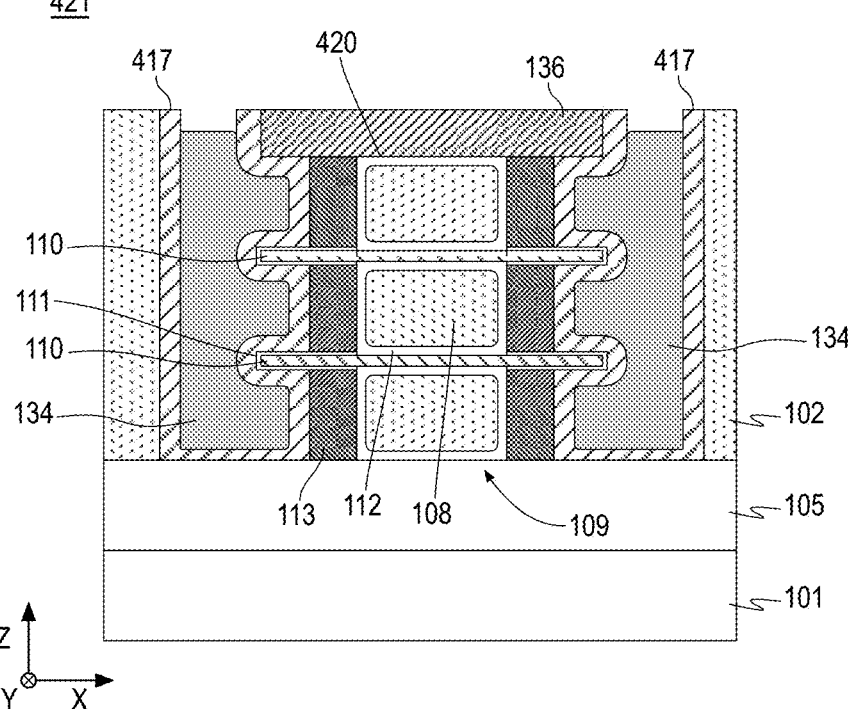

FIG. 4L illustrates a cross-sectional side view of a transistor structure 421 similar to transistor structure 419 after the formation of gate structure 109, which includes gate dielectric 112 and gate electrode 108 such that gate electrode 108 is separated from metal chalcogen layers 110 by gate dielectric 112. Gate dielectric 112 may have a high relative permittivity (i.e., dielectric constant, K). In some high-K gate dielectric embodiments, gate dielectric 112 is a metal oxide including oxygen and one or more metals, such as, but not limited to, aluminum, hafnium, zirconium, tantalum, or titanium. In some embodiments, gate dielectric 112 is silicon oxide. Gate electrode 108 may be or include a metal such as but not limited to platinum, nickel, molybdenum, tungsten, palladium, gold, alloys thereof, or nitrides such as titanium nitride, tantalum nitride, tungsten silicon nitride, or others. In some embodiments, gate electrode 108 includes a work function metal and a fill metal. After deposition of gate dielectric 112 and gate electrode 108, a planarization process is performed to remove the gate dielectric layer and the gate electrode layer from an uppermost surface of transistor structure 421.

Returning to FIG. 3, processing continues at operation 311, where gate, source, and drain contacts are formed. In some embodiments, after gate formation, an overlying dielectric layer is deposited, and source and drain contact openings are formed in the dielectric layer using lithography and etch techniques. The openings are then filled with a contact metal or metal(s), followed by planarization processing.

Figure 4M:
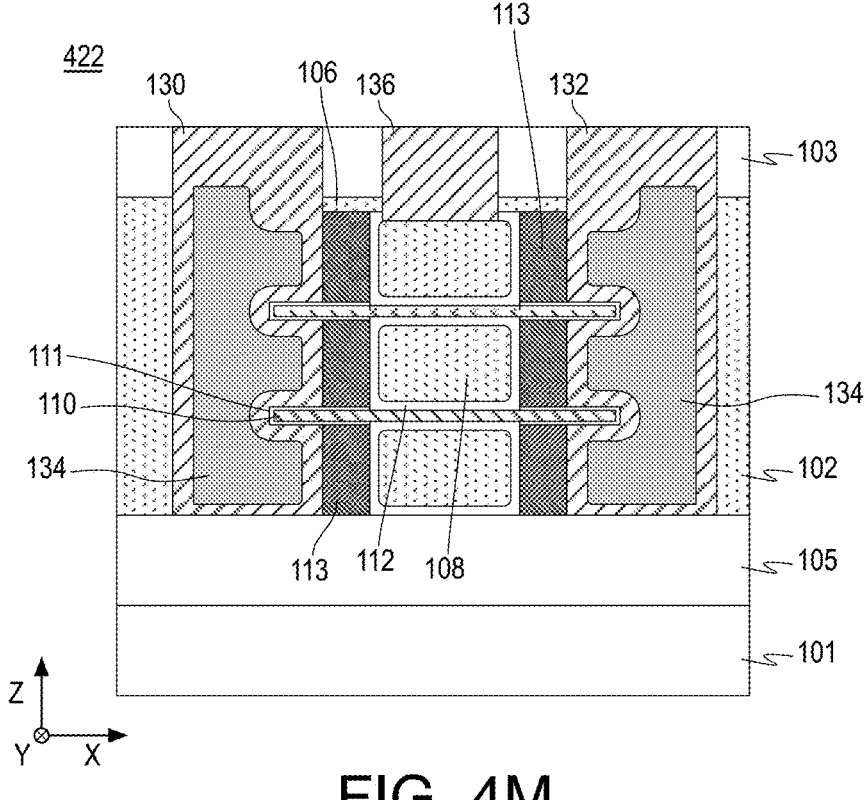

FIG. 4M illustrates a cross-sectional side view of a transistor structure 422 similar to transistor structure 421 after the formation of gate contact 136, source structure 130, drain structure 132, and dielectric material 103. In some embodiments, a bulk dielectric layer is formed over a top surface of transistor structure 421 and a resist layer is deposited and patterned on the bulk dielectric layer. Etch techniques are then used to form openings corresponding to gate contact 136 and remaining portions of source structure 130 and drain structure 132, and the resist layer is removed. The openings are then filled with contact metal and planarization techniques are used to form a planar top surface of transistor structure 422. In some embodiments, the metal of gate contact 136 and remaining portions of source structure 130 and drain structure 132 are the same as that of source and drain contact metal 417, however, other metals may be used.

Returning to FIG. 3, processing continues at operation 312, where continued processing is performed as is known in the art. Such processing may include forming interconnect features including metallization routings and vias, dicing, packaging, assembly, and so on. The resultant device (e.g., integrated circuit die) may then be implemented in any suitable form factor device such as a laptop, a netbook, a notebook, an ultrabook, a smartphone, a tablet, a personal digital assistant, an ultra-mobile PC, a mobile phone, a desktop computer, a server, a printer, a scanner, a monitor, a set-top box, an entertainment control unit, a digital camera, a portable music player, a digital video recorder, or the like.

Returning to operation 306, as discussed, in some embodiments, the regions of material layers exposed at operation 306 may be differentially doped with respect to the doping layer formed at operation 305. Such embodiments are discussed herein below with respect to operation 307 and FIGS. 5A to 5E.

Continuing now with dual doping layer embodiments, processing continues from operation 306 at operation 307, where the exposed portion of the doping layer formed at operation 305 is removed (while leaving the doping layer in the regions obscured by the spacer) and a second doping layer is formed on the exposed portions of each of the material layers (e.g., metal chalcogen layers) by deposition of a metal followed by UV-ozone treatment. The doping layer formed at operation 307 may be formed using techniques discussed with respect to operation 305. For example, a metal layer such as a pure metal layer may be deposited on the exposed portions of each of the material layers by ALD, CVD, PECVD, or MOCVD, and the deposited metal is then oxidized. In some embodiments, the deposited metal is UV-ozone treated to form a non-stoichiometric metal oxide film. The second doping layer may include any characteristics discussed herein.

Figures 5A, 5B:
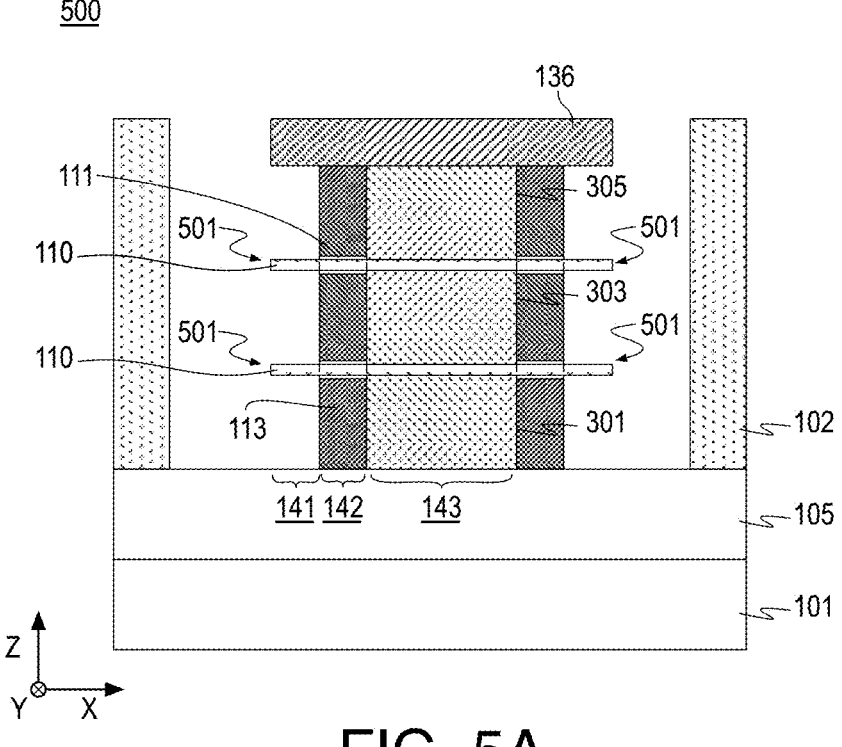
FIGS. 5A, 5B, 5C, 5D, and 5E are cross-sectional views of transistor structures having different doping layers on metal chalcogen layers of the transistor structure evolving as the methods of FIG. 3 are practiced.

FIG. 5A illustrates a cross-sectional side view of a transistor structure 500 similar to transistor structure 415 (refer to FIG. 4H) after removal of exposed portions of doping layers 111 to reveal portions 501 of metal chalcogen layers 110. Exposed portions of doping layers 111 may be removed using any suitable technique or techniques such as selective etch techniques. As shown, doping layers 111 remain in spacer region 142 while being removed from portions 501 in source and drain contact regions 141.

FIG. 5B illustrates a cross-sectional side view of a transistor structure 502 similar to transistor structure 500 after formation of doping layers 151 on source and drain contact regions 141 of metal chalcogen layers 110 via metal deposition operation 571 followed by UV-ozone treatment operation 572. The metal layer may be formed at metal deposition operation 471 using CVD, PECVD, MOCVD, or other techniques. Doping layers 151 are then formed via oxidation of the metal layer at UV-ozone treatment operation 572. For example, UV-ozone treatment operation 572 may include exposing the metal layer to an ozone environment and UV light simultaneously. Doping layers 151 may have any characteristics discussed elsewhere herein.

Figure 5C:
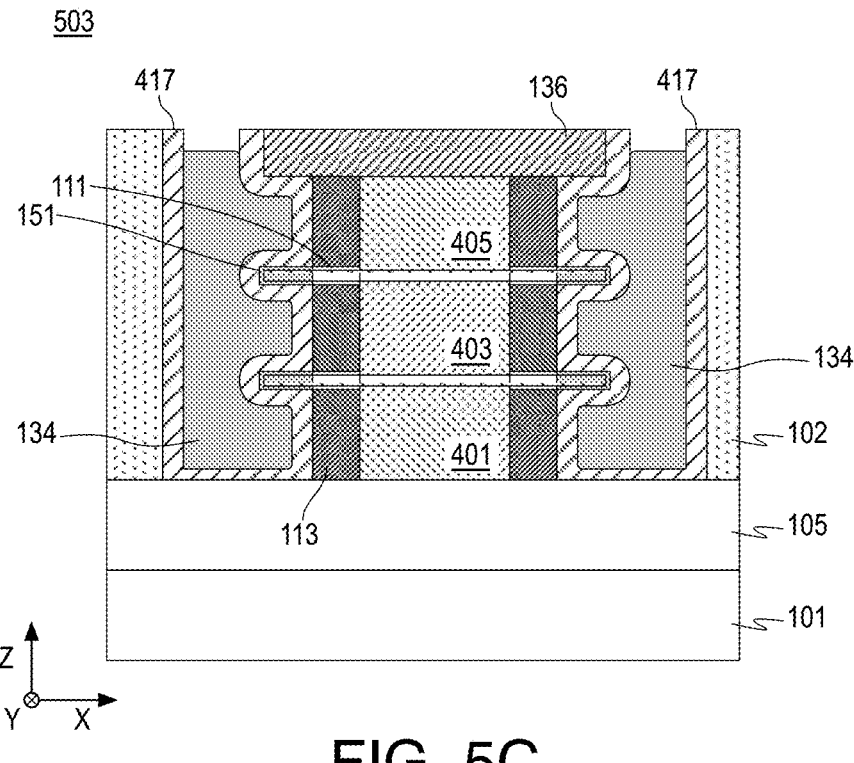

Returning to FIG. 3, processing continues from operation 307 at operation 308, where a source and drain contact metal and subsequent fill metal are formed as discussed above. FIG. 5C illustrates a cross-sectional side view of a transistor structure 503 similar to transistor structure 502 after the deposition of source and drain contact metal 417, deposition of fill metal 134, and planarization processing.

Figure 5D:
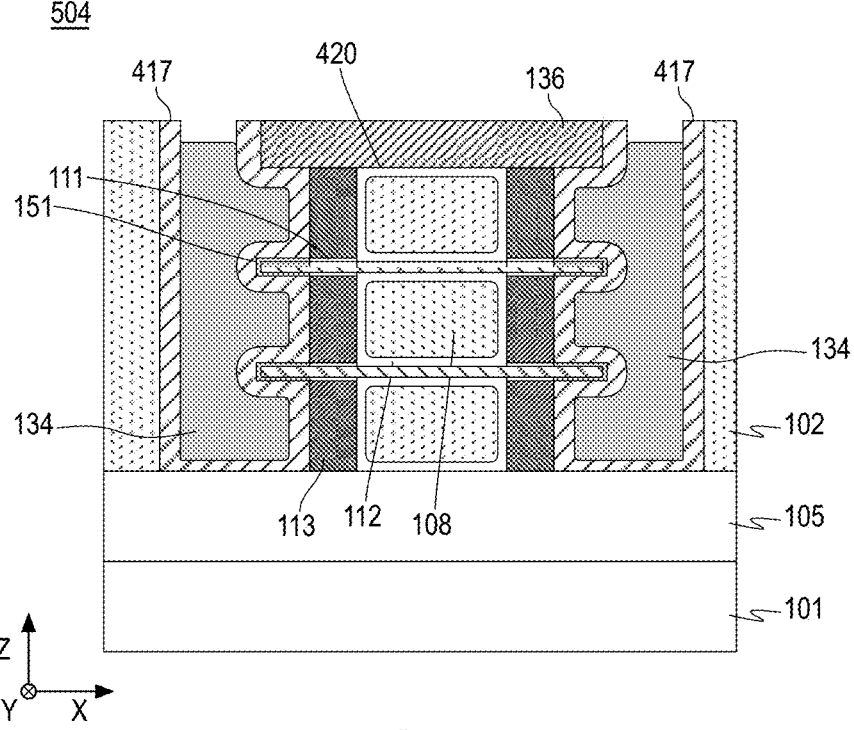

Returning to FIG. 3, processing continues at operation 309, where remaining portions of the sacrificial layers of the multilayer stack are removed, and operation 310, where gate structures are formed within the openings vacated by the removal of the remaining portions of the sacrificial layers. Such operations are performed as discussed above. FIG. 5D illustrates a cross-sectional side view of a transistor structure 504 similar to transistor structure 503 after the removal of the remaining portions of sacrificial layers 401, 403, 405 to provide gate structure openings 420 and after the formation of gate structure 109, which includes gate dielectric 112 and gate electrode 108 such that gate electrode 108 is separated from metal chalcogen layers 110 by gate dielectric 112.

Figure 5E:
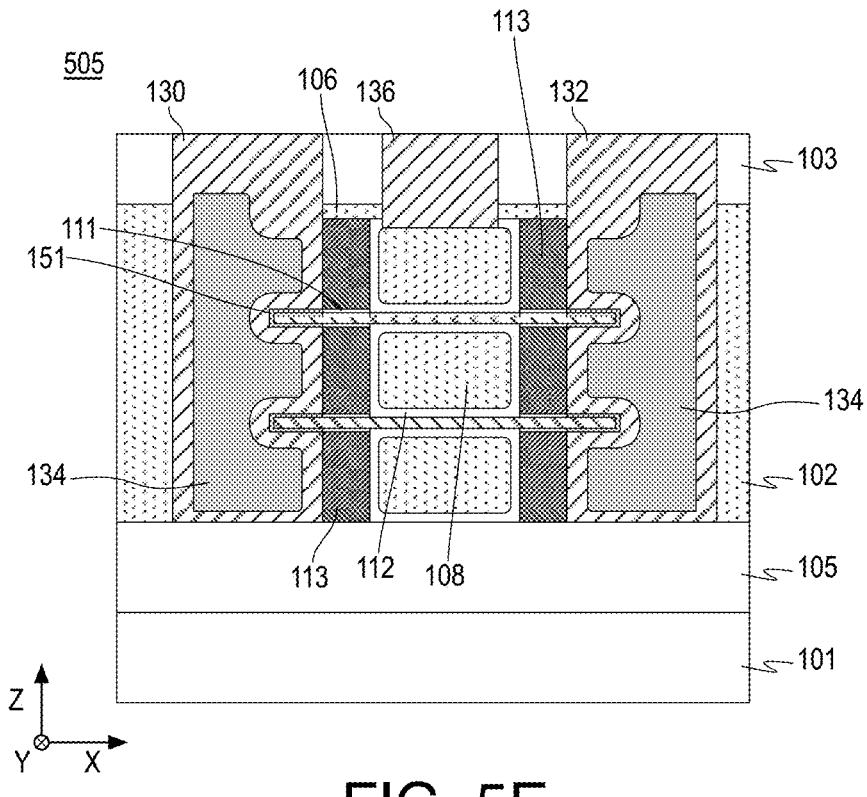

Returning to FIG. 3, processing continues at operation 311, where gate, source, and drain contacts are formed as discussed above. FIG. 5E illustrates a cross-sectional side view of a transistor structure 505 similar to transistor structure 504 after the formation of gate contact 136, source structure 130, drain structure 132, and dielectric material 103.

Returning to FIG. 3, processing continues at operation 312, where continued processing is performed as is known in the art. As discussed, methods 300 provide for receiving a multilayer stack comprising material layers 402, 404 interleaved with sacrificial layers 401, 403, 405, such that the material layers 402, 404 may each include a transition metal and a chalcogen. For example, material layers 402, 404 may be TMD materials. Material 402, 404 are patterned to form metal chalcogen layers 110. A portion of each of metal chalcogen layers 110 are exposed at operation 304 and/or operation 308 and a metal is deposited on the exposed portions at operation 305 and/or operation 307. An ultraviolet light and ozone treatment (e.g., UV-ozone treatment) is applied to the deposited metal to form doping layers 111 (e.g., second material layers) on the exposed portions of metal chalcogen layers 110, such that doping layers 111 include the deposited metal and oxygen. For example, doping layers 111 may be an oxide of the deposited metal such as a non-stoichiometric metal oxide film. Source and drain structures 130, 132 and gate structure 109 are then coupled to metal chalcogen layers 110 as discussed with respect to operations 308-310.

Figure 6:
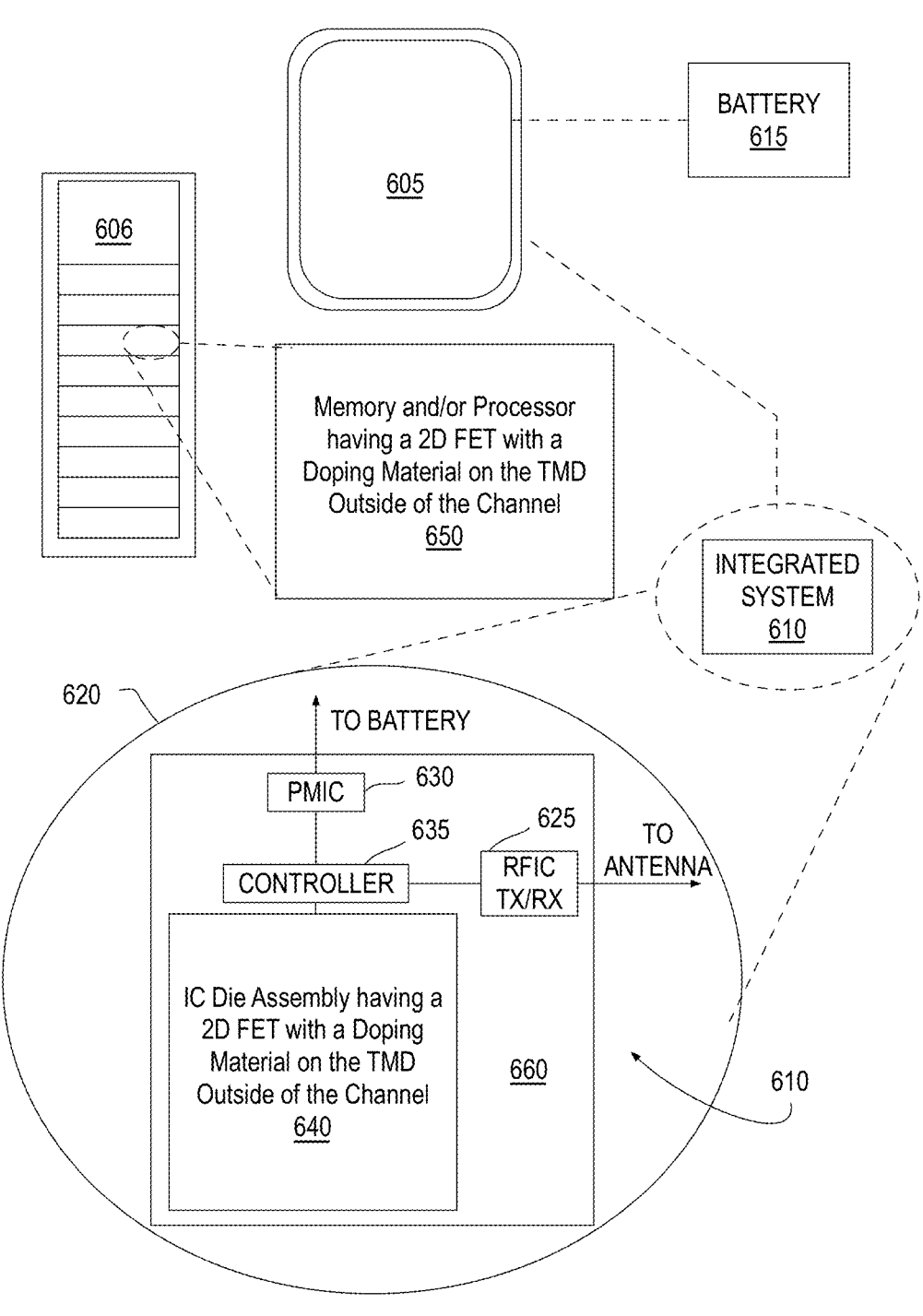
FIG. 6 illustrates exemplary systems employing metal chalcogen material-based transistor structures having a doping layer on the metal chalcogen layer outside of a channel region of the metal chalcogen layer.

FIG. 6 illustrates exemplary systems employing metal chalcogen material-based transistor structures having a doping layer on the metal chalcogen layer outside of a channel region of the metal chalcogen layer, in accordance with some embodiments. The system may be a mobile computing platform 605 and/or a data server machine 606, for example. Either may employ a monolithic IC die, for example, having a field effect transistor having a metal chalcogen layer (e.g., nanoribbon) with a doping layer on the metal chalcogen layer outside of a channel region of the metal chalcogen layer as described elsewhere herein. Server machine 606 may be any commercial server, for example including any number of high-performance computing platforms disposed within a rack and networked together for electronic data processing, which in the exemplary embodiment includes an IC die assembly 650 with a field effect transistor having field effect transistor having a metal chalcogen layer with a doping layer on the metal chalcogen layer outside of a channel region of the metal chalcogen layer as described elsewhere herein. Mobile computing platform 605 may be any portable device configured for each of electronic data display, electronic data processing, wireless electronic data transmission, or the like. For example, mobile computing platform 605 may be any of a tablet, a smart phone, a laptop computer, etc., and may include a display screen (e.g., a capacitive, inductive, resistive, or optical touchscreen), a chip-level or package-level integrated system 610, and a battery/power supply 615. Although illustrated with respect to mobile computing platform 605, in other examples, chip-level or package-level integrated system 610 and a battery/power supply 615 may be implemented in a desktop computing platform, an automotive computing platform, an internet of things platform, or the like. As discussed below, in some examples, the disclosed systems may include a sub-system 660 such as a system on a chip (SOC) or an integrated system of multiple ICs, which is illustrated with respect to mobile computing platform 605.

Whether disposed within integrated system 610 illustrated in expanded view 620 or as a stand-alone packaged device within data server machine 606, sub-system 660 may include memory circuitry and/or processor circuitry 640 (e.g., RAM, a microprocessor, a multi-core microprocessor, graphics processor, etc.), a power management integrated circuit (PMIC) 630, a controller 635, and a radio frequency integrated circuit (RFIC) 625 (e.g., including a wideband RF transmitter and/or receiver (TX/RX)). As shown, one or more IC dice, such as memory circuitry and/or processor circuitry 640 may be assembled and implemented such that one or more have a metal chalcogen layer with a doping layer on the metal chalcogen layer outside of a channel region of the metal chalcogen layer as described herein. In some embodiments, RFIC 625 includes a digital baseband and an analog front end module further comprising a power amplifier on a transmit path and a low noise amplifier on a receive path). Functionally, PMIC 630 may perform battery power regulation, DC-to-DC conversion, etc., and so has an input coupled to battery/power supply 615, and an output providing a current supply to other functional modules. As further illustrated in FIG. 6, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 640 may provide memory functionality for sub-system 660, high level control, data processing and the like for sub-system 660. In alternative implementations, each of the SOC modules may be integrated onto separate ICs coupled to a package substrate, interposer, or board.

Figure 7:
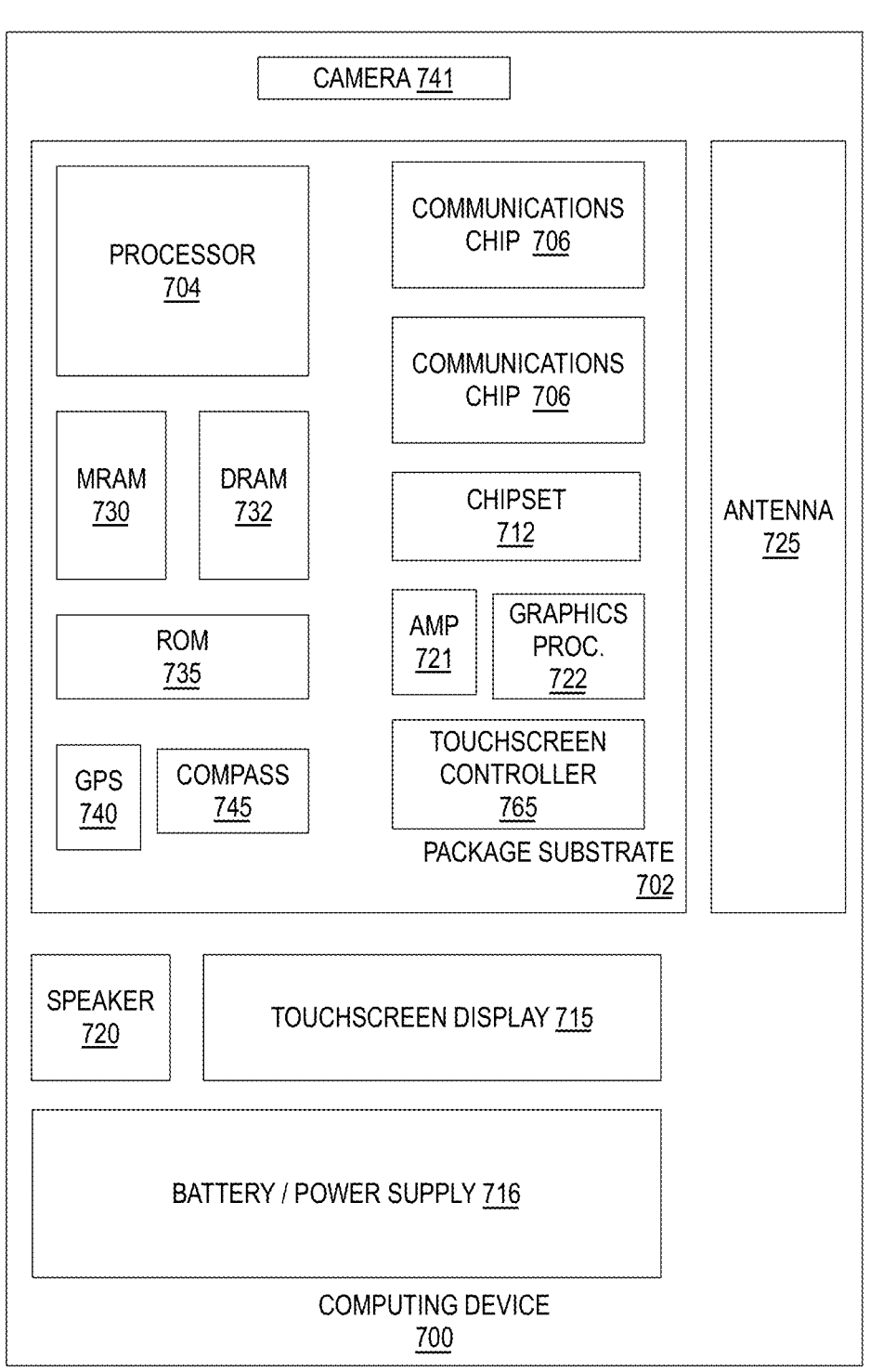
FIG. 7 is a functional block diagram of an electronic computing device, all in accordance with some embodiments.

FIG. 7 is a functional block diagram of an electronic computing device 700, in accordance with some embodiments. For example, device 700 may, via any suitable component therein, implement a field effect transistor having a metal chalcogen layer with a doping layer on the metal chalcogen layer outside of a channel region of the metal chalcogen layer as discussed herein. For example, one or more IC dies of electronic computing device 700 may deploy a GAA transistor having a metal chalcogen layer with a doping layer on the metal chalcogen layer outside of the channel region. Device 700 further includes a motherboard or package substrate 702 hosting a number of components, such as, but not limited to, a processor 704 (e.g., an applications processor). Processor 704 may be physically and/or electrically coupled to package substrate 702. In some examples, processor 704 is within an IC assembly. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the package substrate 702. In further implementations, communication chips 706 may be part of processor 704. Depending on its applications, computing device 700 may include other components that may or may not be physically and electrically coupled to package substrate 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery/power supply 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth, or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. Battery/power supply 716 may include any suitable power supply circuitry and, optionally, a battery source to provide power to components of electronic computing device 700.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

The following pertain to exemplary embodiments.

In one or more first embodiments, a transistor structure comprises a first material layer comprising a transition metal and a chalcogen, the first material layer having a channel region, a gate structure directly on the channel region of the first material layer, a source or drain structure coupled to the first material layer, a spacer between the source or drain structure and the gate structure, and a second material layer directly on a region of the first material layer between the channel region and the source or drain structure, the second material layer comprising oxygen and a metal.

In one or more second embodiments, further to the first embodiments, the second material layer comprises a non-stoichiometric metal oxide layer.

In one or more third embodiments, further to the first or second embodiments, the metal comprises one of germanium, aluminum, lanthanum, magnesium, niobium, gallium, antimony, scandium, yttrium, gadolinium, molybdenum, or tungsten.

In one or more fourth embodiments, further to the first through third embodiments, the transition metal comprises molybdenum or tungsten, the chalcogen comprises sulfur, and the metal comprises one of lanthanum, magnesium, scandium, yttrium, or gadolinium.

In one or more fifth embodiments, further to the first through fourth embodiments, the transition metal comprises molybdenum or tungsten, the chalcogen comprises selenium, and the metal comprises one of germanium, aluminum, niobium, aluminum, or gallium.

In one or more sixth embodiments, further to the first through fifth embodiments, the first material layer comprises a source or drain contact region and the region is between the channel region and the source or drain contact region, the transistor structure further comprising a third material layer directly on the source or drain contact region of the first material layer, the third material layer comprising oxygen and a second metal.

In one or more seventh embodiments, further to the first through sixth embodiments, the metal comprises one of lanthanum, magnesium, scandium, yttrium, or gadolinium, and the second metal comprises another of lanthanum, magnesium, scandium, yttrium, or gadolinium.

In one or more eighth embodiments, further to the first through seventh embodiments, the metal comprises one of germanium, aluminum, niobium, aluminum, or gallium, and the second metal comprises another of germanium, aluminum, niobium, aluminum, or gallium.

In one or more ninth embodiments, further to the first through eighth embodiments, the first material layer comprises a transition metal dichalcogenide molecular monolayer.

In one or more tenth embodiments, further to the first through ninth embodiments, the transistor structure further comprises a stack of nanoribbons coupled to the source or drain structure, wherein a first of the stack of nanoribbons comprises the first material layer and the gate structure is directly on a channel region of each of the nanoribbons, and a metal oxide doping layer on a region of each of the nanoribbons between the channel region of each of the nanoribbons and the source or drain structure, wherein a first of the metal oxide doping layers comprises the second material layer.

In one or more eleventh embodiments, a system comprises an IC die comprising a transistor structure according to any of the first through tenth embodiments, and a power supply coupled to the IC die.

In one or more twelfth embodiments, a system comprises an integrated circuit (IC) die comprising a transistor, the transistor comprising a stack of nanoribbons coupled to a source or drain structure, each of the nanoribbons comprising a transition metal and a chalcogen and each of the nanoribbons comprising a channel region, a gate structure directly on the channel regions of the nanoribbons, a spacer between the source or drain structure and the gate structure, and a doping layer directly on a region of each of nanoribbons between the channel region of each of nanoribbons and the source or drain structure, the doping layer comprising oxygen and a metal, and a power supply coupled to the IC die.

In one or more thirteenth embodiments, further to the twelfth embodiments, the metal comprises one of germanium, aluminum, lanthanum, magnesium, niobium, gallium, antimony, scandium, yttrium, gadolinium, molybdenum, or tungsten.

In one or more fourteenth embodiments, further to the twelfth or thirteenth embodiments, the transition metal comprises molybdenum or tungsten, the chalcogen comprises sulfur, and the metal comprises one of lanthanum, magnesium, scandium, yttrium, or gadolinium.

In one or more fifteenth embodiments, further to the twelfth through fourteenth embodiments, the transition metal comprises molybdenum or tungsten, the chalcogen comprises selenium, and the metal comprises one of germanium, aluminum, niobium, aluminum, or gallium.

In one or more sixteenth embodiments, further to the twelfth through fifteenth embodiments, each of the nanoribbons comprises a source or drain contact region and the region is between the channel region and the source or drain contact region for each of the nanoribbons, the transistor further comprising a second doping layer directly on the source or drain contact region of each of nanoribbons, the second doping layer comprising oxygen and a second metal.

In one or more seventeenth embodiments, a method comprises receiving a multilayer stack comprising a plurality of first material layers interleaved with a plurality of sacrificial layers, wherein the first material layers each comprise a transition metal and a chalcogen, exposing a portion of each of the first material layers, depositing a metal on the exposed portions of the first material layers, applying an ultra-violet light and ozone treatment to the metal to form a second material layer on the exposed portions of the first material layers, the second material layer comprising the metal and oxygen, and coupling a source or drain structure and a gate structure to the first material layers.

In one or more eighteenth embodiments, further to the seventeenth embodiments, said applying the ultra-violet light and ozone treatment forms the second material layer comprising a non-stoichiometric metal oxide layer.

In one or more nineteenth embodiments, further to the seventeenth or eighteenth embodiments, the method further comprises forming a spacer material over the second material layers, removing a portion of the spacer material to expose a portion of each of the second material layers, removing the exposed portions of the second material layers to expose a second portion of the first material layers, depositing a second metal on the exposed second portions of the first material layers, and applying a second ultra-violet light and ozone treatment to the second metal to form a third material layer on the exposed second portions of the first material layers, the third material layer comprising the second metal and oxygen.

In one or more twentieth embodiments, further to the seventeenth through nineteenth embodiments, the metal comprises one of lanthanum, magnesium, scandium, yttrium, or gadolinium, and the second metal comprises another of lanthanum, magnesium, scandium, yttrium, or gadolinium.

In one or more twenty-first embodiments, further to the seventeenth through twentieth embodiments, the metal comprises one of germanium, aluminum, niobium, aluminum, or gallium, and the second metal comprises another of germanium, aluminum, niobium, aluminum, or gallium.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
a first material layer comprising a transition metal and a chalcogen, the first material layer having a channel region;
a gate structure directly on the channel region of the first material layer;
a source or drain structure coupled to the first material layer;
a spacer between the source or drain structure and the gate structure; and
a second material layer directly on a region of the first material layer between the channel region and the source or drain structure, the second material layer comprising oxygen and a metal.

2. The transistor structure of claim 1, wherein the second material layer comprises a non-stoichiometric metal oxide layer.

3. The transistor structure of claim 1, wherein the metal comprises one of germanium, aluminum, lanthanum, magnesium, niobium, gallium, antimony, scandium, yttrium, gadolinium, molybdenum, or tungsten.

4. The transistor structure of claim 1, wherein the transition metal comprises molybdenum or tungsten, the chalcogen comprises sulfur, and the metal comprises one of lanthanum, magnesium, scandium, yttrium, or gadolinium.

5. The transistor structure of claim 1, wherein the transition metal comprises molybdenum or tungsten, the chalcogen comprises selenium, and the metal comprises one of germanium, aluminum, niobium, aluminum, or gallium.

6. The transistor structure of claim 1, wherein the first material layer comprises a source or drain contact region and the region is between the channel region and the source or drain contact region, the transistor structure further comprising:
a third material layer directly on the source or drain contact region of the first material layer, the third material layer comprising oxygen and a second metal.

7. The transistor structure of claim 6, wherein the metal comprises one of lanthanum, magnesium, scandium, yttrium, or gadolinium, and the second metal comprises another of lanthanum, magnesium, scandium, yttrium, or gadolinium.

8. The transistor structure of claim 6, wherein the metal comprises one of germanium, aluminum, niobium, aluminum, or gallium, and the second metal comprises another of germanium, aluminum, niobium, aluminum, or gallium.

9. The transistor structure of claim 1, wherein the first material layer comprises a transition metal dichalcogenide molecular monolayer.

10. The transistor structure of claim 9, further comprising:
a stack of nanoribbons coupled to the source or drain structure, wherein a first of the stack of nanoribbons comprises the first material layer and the gate structure is directly on a channel region of each of the nanoribbons; and
a metal oxide doping layer on a region of each of the nanoribbons between the channel region of each of the nanoribbons and the source or drain structure, wherein a first of the metal oxide doping layers comprises the second material layer.

11. A system, comprising:
an integrated circuit (IC) die comprising a transistor, the transistor comprising:

22 a stack of nanoribbons coupled to a source or drain structure, each of the nanoribbons comprising a transition metal and a chalcogen and each of the nanoribbons comprising a channel region;
a gate structure directly on the channel regions of the nanoribbons;
a spacer between the source or drain structure and the gate structure; and
a doping layer directly on a region of each of nanoribbons between the channel region of each of nanoribbons and the source or drain structure, the doping layer comprising oxygen and a metal; and
a power supply coupled to the IC die.

12. The system of claim 11, wherein the metal comprises one of germanium, aluminum, lanthanum, magnesium, niobium, gallium, antimony, scandium, yttrium, gadolinium, molybdenum, or tungsten.

13. The system of claim 11, wherein the transition metal comprises molybdenum or tungsten, the chalcogen comprises sulfur, and the metal comprises one of lanthanum, magnesium, scandium, yttrium, or gadolinium.

14. The system of claim 11, wherein the transition metal comprises molybdenum or tungsten, the chalcogen comprises selenium, and the metal comprises one of germanium, aluminum, niobium, aluminum, or gallium.

15. The system of claim 11, wherein each of the nanoribbons comprises a source or drain contact region and the region is between the channel region and the source or drain contact region for each of the nanoribbons, the transistor further comprising:
a second doping layer directly on the source or drain contact region of each of nanoribbons, the second doping layer comprising oxygen and a second metal.

16. A method, comprising:
receiving a multilayer stack comprising a plurality of first material layers interleaved with a plurality of sacrificial layers, wherein the first material layers each comprise a transition metal and a chalcogen;
exposing a portion of each of the first material layers;
depositing a metal on the exposed portions of the first material layers;
applying an ultra-violet light and ozone treatment to the metal to form a second material layer on the exposed portions of the first material layers, the second material layer comprising the metal and oxygen; and
coupling a source or drain structure and a gate structure to the first material layers.

17. The method of claim 16, wherein said applying the ultra-violet light and ozone treatment forms the second material layer comprising a non-stoichiometric metal oxide layer.

18. The method of claim 16, further comprising:
forming a spacer material over the second material layers;
removing a portion of the spacer material to expose a portion of each of the second material layers;
removing the exposed portions of the second material layers to expose a second portion of the first material layers;
depositing a second metal on the exposed second portions of the first material layers; and
applying a second ultra-violet light and ozone treatment to the second metal to form a third material layer on the exposed second portions of the first material layers, the third material layer comprising the second metal and oxygen.

19. The method of claim 18, wherein the metal comprises one of lanthanum, magnesium, scandium, yttrium, or gadolinium, and the second metal comprises another of lanthanum, magnesium, scandium, yttrium, or gadolinium.

20. The method of claim 18, wherein the metal comprises one of germanium, aluminum, niobium, aluminum, or gallium, and the second metal comprises another of germanium, aluminum, niobium, aluminum, or gallium.

* * * * *